(12) United States Patent
Tsai et al.

(10) Patent No.: US 11,348,841 B2
(45) Date of Patent: May 31, 2022

(54) SEMICONDUCTOR DEVICE STRUCTURE WITH RECESSED SPACER

(71) Applicant: TAIWAN SEMICONDUCTOR MANUFACTURING COMPANY, LTD., Hsinchu (TW)

(72) Inventors: Ming-Heng Tsai, Taipei (TW); Chun-Sheng Liang, Puyan Township (TW); Pei-Lin Wu, Kaohsiung (TW); Yi-Ren Chen, Taoyuan (TW); Shih-Hsun Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/006,130

(22) Filed: Aug. 28, 2020

(65) Prior Publication Data

US 2020/0395253 A1 Dec. 17, 2020

Related U.S. Application Data

(60) Continuation of application No. 16/196,642, filed on Nov. 20, 2018, now Pat. No. 10,763,178, which is a
(Continued)

(51) Int. Cl.
*H01L 29/78* (2006.01)
*H01L 21/8238* (2006.01)
(Continued)

(52) U.S. Cl.
CPC ........ *H01L 21/823814* (2013.01); *H01L 21/823418* (2013.01); *H01L 21/823425* (2013.01);
(Continued)

(58) Field of Classification Search
CPC ........ H01L 29/66545; H01L 29/66553; H01L 29/6653; H01L 29/6656; H01L 21/823418;
(Continued)

(56) References Cited

U.S. PATENT DOCUMENTS 6,777,760 B1 * 8/2004 Jan ..................... H01L 29/665
257/384
8,039,179 B2 10/2011 Shieh et al.
(Continued)

*Primary Examiner* — Eric A. Ward
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a gate stack over the substrate, wherein the gate stack has a first portion and a second portion under the first portion, and the first portion is wider than the second portion. The semiconductor device structure includes a first spacer and a second spacer over opposite sides of the gate stack. The first spacer has a first upper portion and a first lower portion, the second spacer has a second upper portion and a second lower portion. The first spacer has a first recess, the first upper portion is between the first recess and the gate stack, the first lower portion is under the first recess, and the first recess has a first inner wall facing away from the gate stack.

20 Claims, 36 Drawing Sheets

Related U.S. Application Data division of application No. 15/167,010, filed on May 27, 2016, now Pat. No. 10,147,649.

(51) Int. Cl.
| | |
|---|---|
| *H01L 29/08* | (2006.01) |
| *H01L 29/161* | (2006.01) |
| *H01L 29/16* | (2006.01) |
| *H01L 29/165* | (2006.01) |
| *H01L 29/24* | (2006.01) |
| *H01L 29/267* | (2006.01) |
| *H01L 21/8234* | (2006.01) |
| *H01L 29/423* | (2006.01) |
| *H01L 29/49* | (2006.01) |

(52) U.S. Cl.
CPC ........ *H01L 29/0847* (2013.01); *H01L 29/161* (2013.01); *H01L 29/165* (2013.01); *H01L 29/1608* (2013.01); *H01L 29/24* (2013.01); *H01L 29/267* (2013.01); *H01L 29/42368* (2013.01); *H01L 29/4966* (2013.01); *H01L 29/785* (2013.01); *H01L 29/7848* (2013.01); *H01L 21/823431* (2013.01); *H01L 21/823481* (2013.01)

(58) Field of Classification Search
CPC ..... H01L 21/823425; H01L 21/823431; H01L 21/823481; H01L 21/823814
See application file for complete search history.

(56) References Cited

U.S. PATENT DOCUMENTS

| | | | |
|---|---|---|---|
| 8,202,681 | B2 | 6/2012 | Lin et al. |
| 8,278,179 | B2 | 10/2012 | Lin et al. |
| 8,728,332 | B2 | 5/2014 | Lin et al. |
| 8,822,243 | B2 | 9/2014 | Yan et al. |
| 2006/0091468 | A1 | 5/2006 | Liaw |
| 2009/0127627 | A1* | 5/2009 | Iwasaki ............... H01L 29/6653 257/369 |
| 2011/0062501 | A1* | 3/2011 | Soss .................. H01L 21/28114 257/288 |
| 2011/0127589 | A1 | 6/2011 | Chen et al. |
| 2011/0281208 | A1 | 11/2011 | Lin et al. |
| 2012/0049247 | A1 | 3/2012 | Lee et al. |
| 2012/0264286 | A1 | 10/2012 | Yeo |
| 2012/0278776 | A1 | 11/2012 | Lei et al. |
| 2012/0286375 | A1* | 11/2012 | Cai ................... H01L 21/28114 257/412 |
| 2013/0017680 | A1* | 1/2013 | Haran ............... H01L 29/66545 438/595 |
| 2013/0187236 | A1* | 7/2013 | Xie ................ H01L 21/823842 257/369 |
| 2013/0270613 | A1 | 10/2013 | Chou et al. |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |
| 2016/0133744 | A1* | 5/2016 | Zhao .................. H01L 29/7851 257/401 |
| 2016/0172496 | A1 | 6/2016 | Chang et al. |
| 2016/0379873 | A1 | 12/2016 | Bu et al. |
| 2017/0103981 | A1 | 4/2017 | Hung et al. |
| 2017/0133479 | A1 | 5/2017 | Wang et al. |

\* cited by examiner

SEMICONDUCTOR DEVICE STRUCTURE WITH RECESSED SPACER

CROSS REFERENCE

This application is a Continuation application of U.S. application Ser. No. 16/196,642, filed on Nov. 20, 2018, which is a Divisional of U.S. application Ser. No. 15/167,010, filed on May 27, 2016, now U.S. Pat. No. 10,147,649, issued Dec. 4, 2018 the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, although existing manufacturing processes for forming semiconductor devices have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
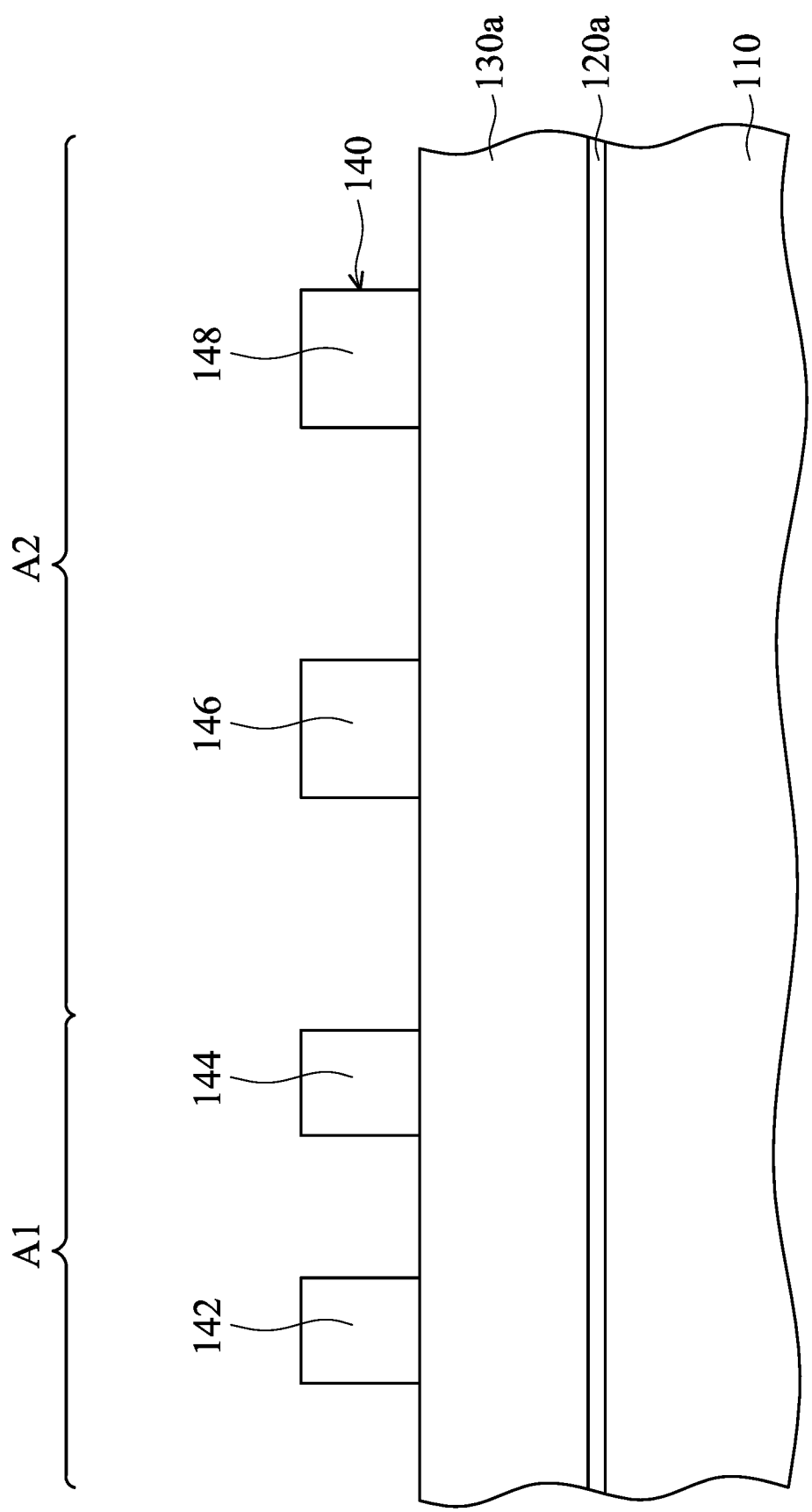
FIGS. 1A-1U are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
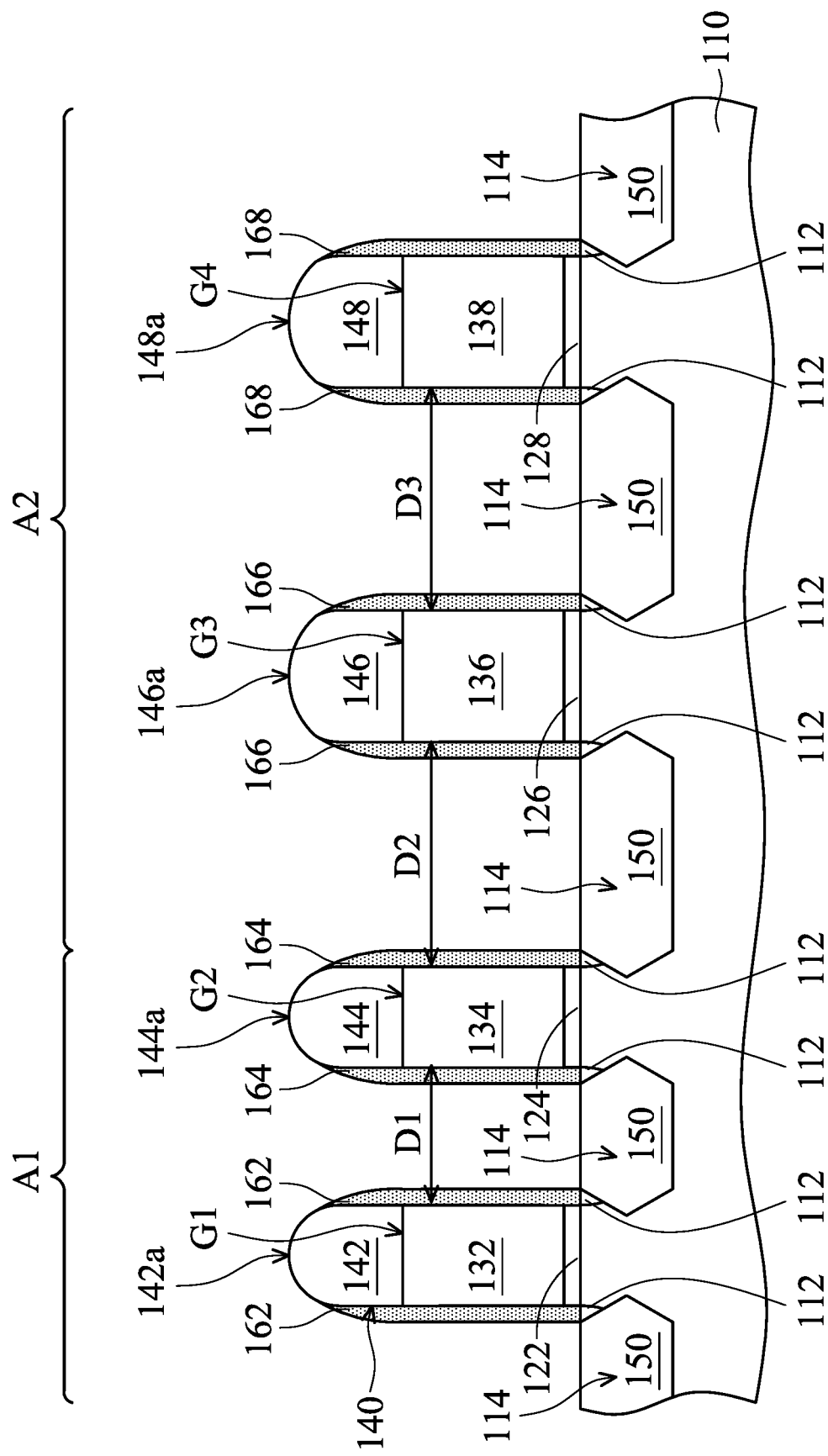
Figure 1C:
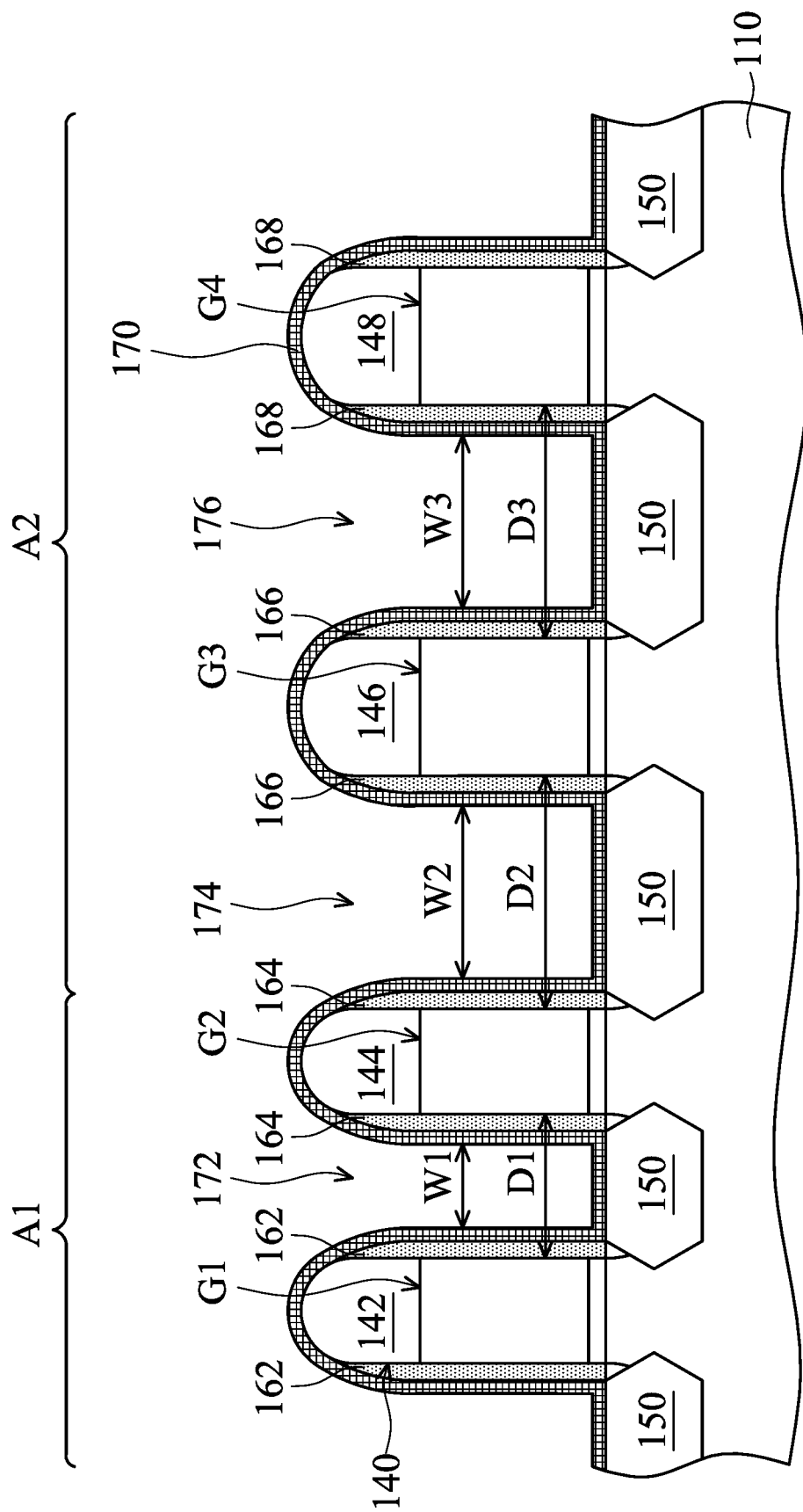
Figure 1D:
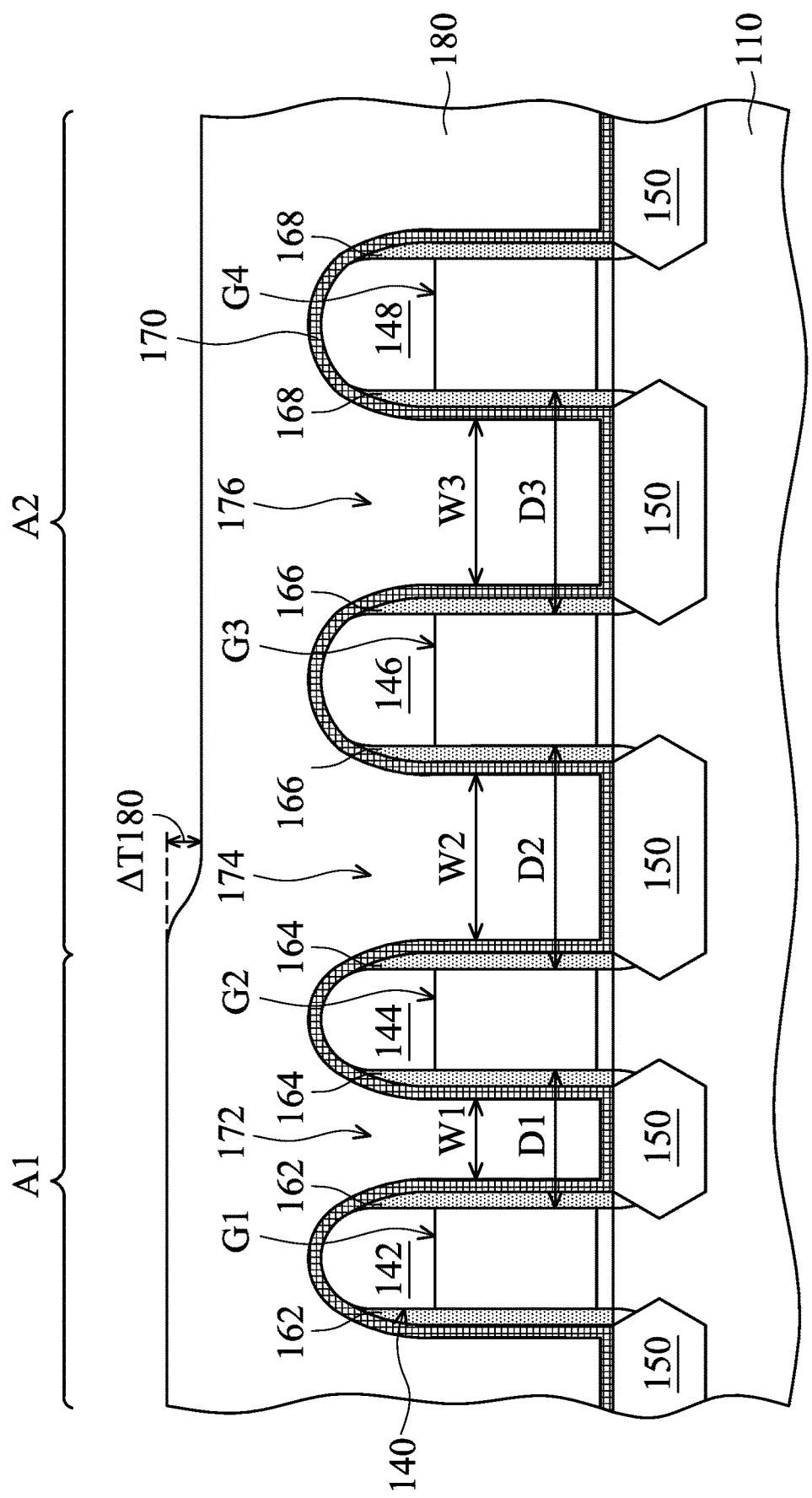
Figure 1E:
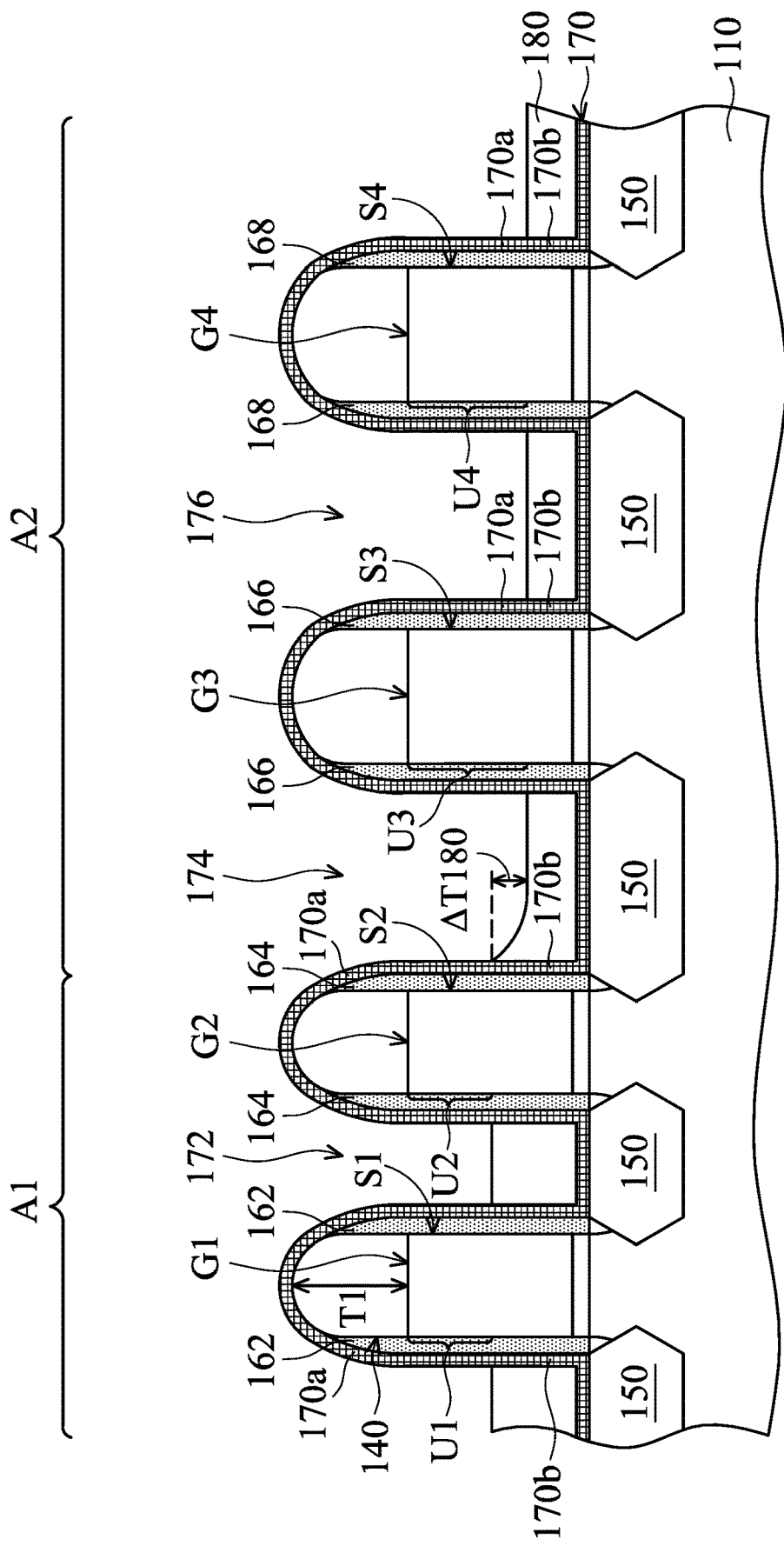
Figure 1F:
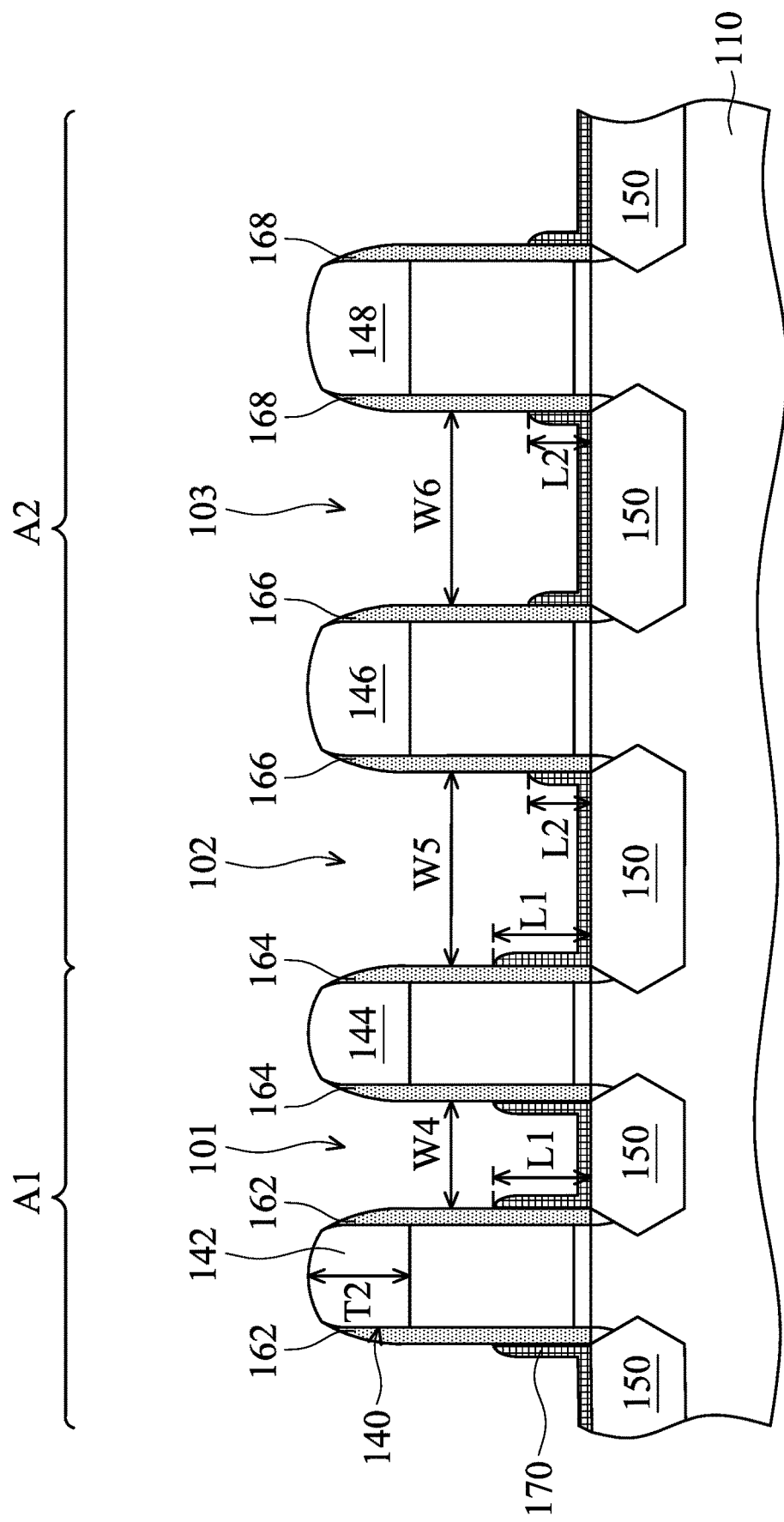
Figure 1G:
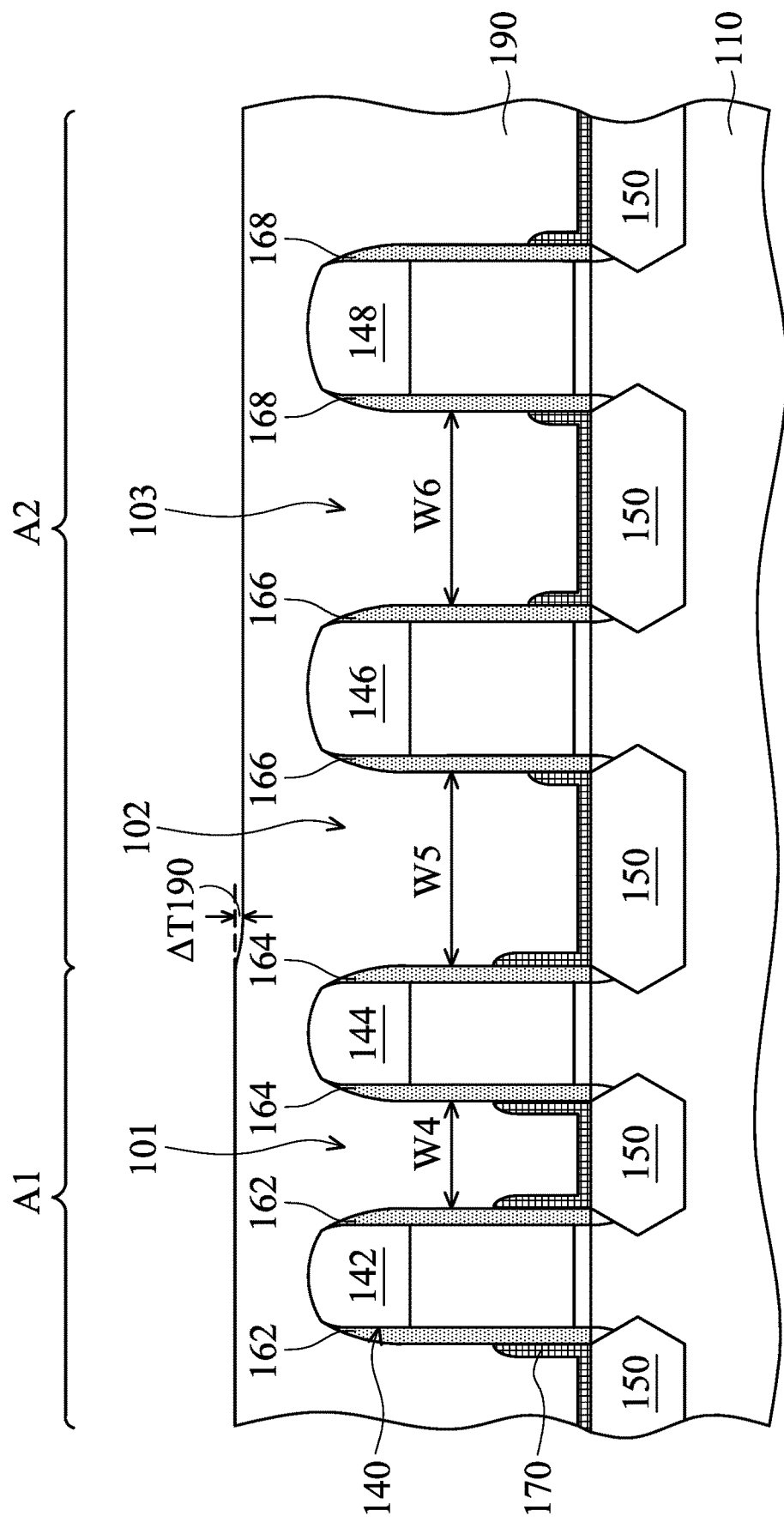
Figure 1H:
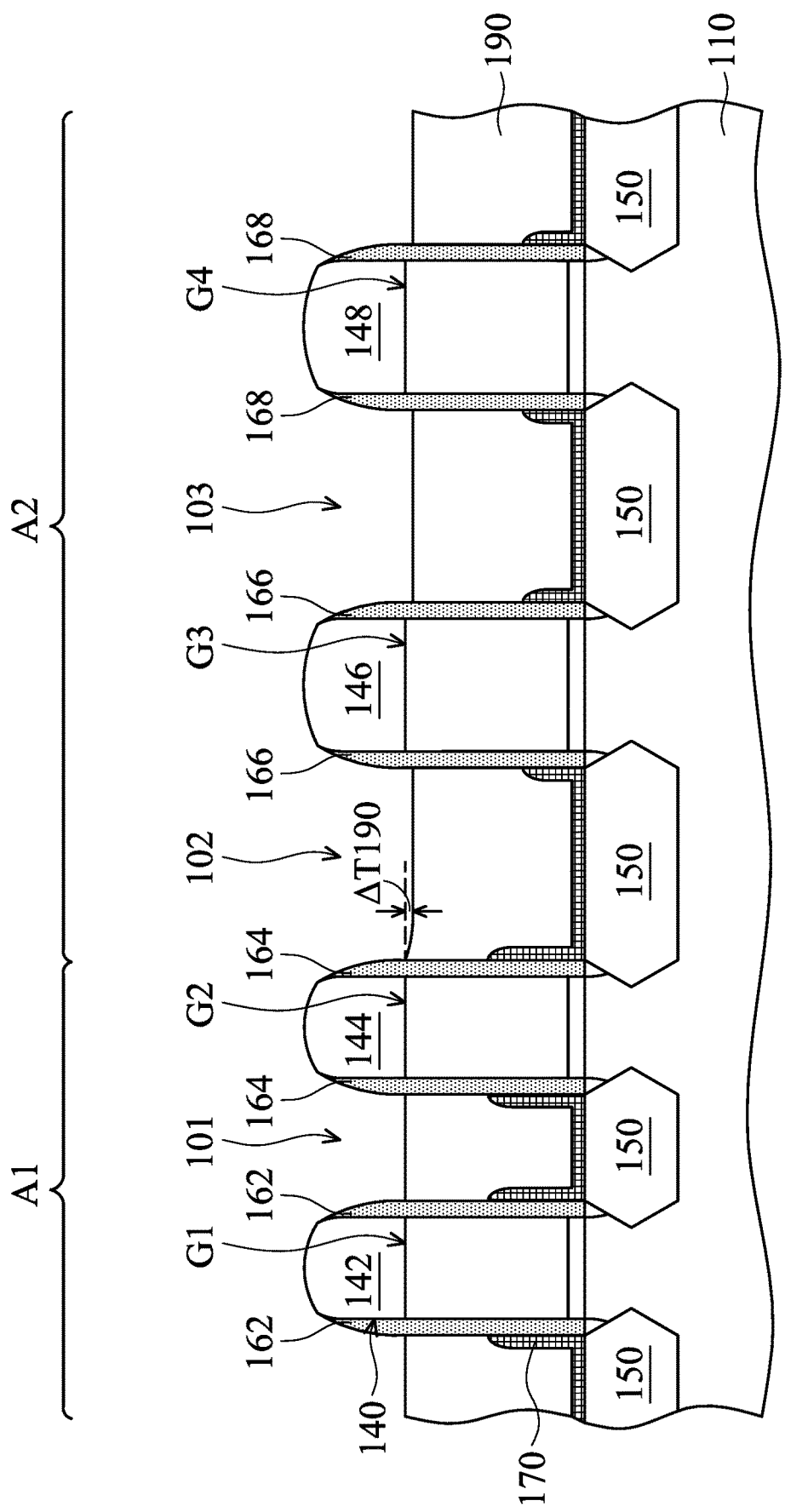
Figure 1I:
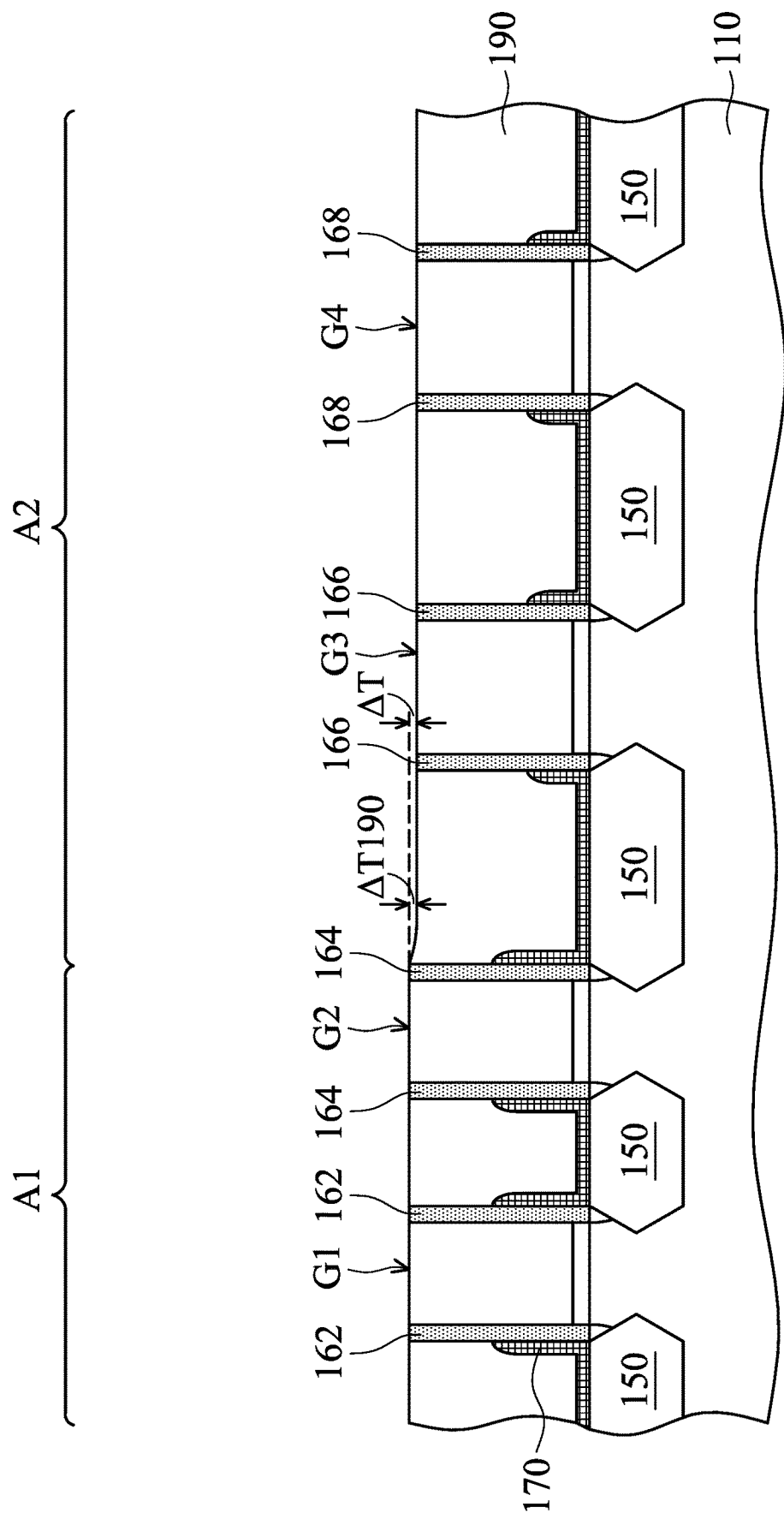
Figure 1J:
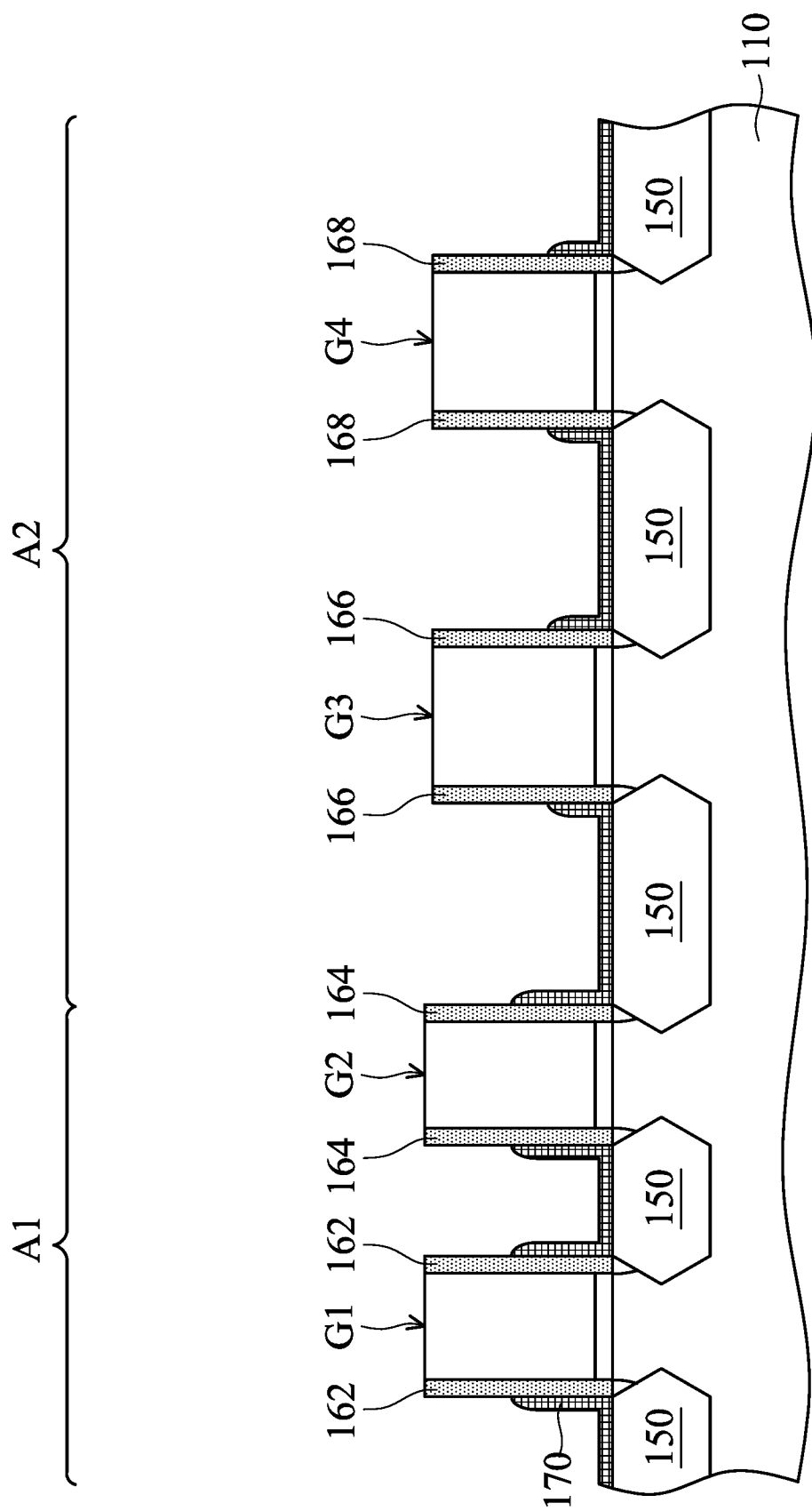
Figure 1K:
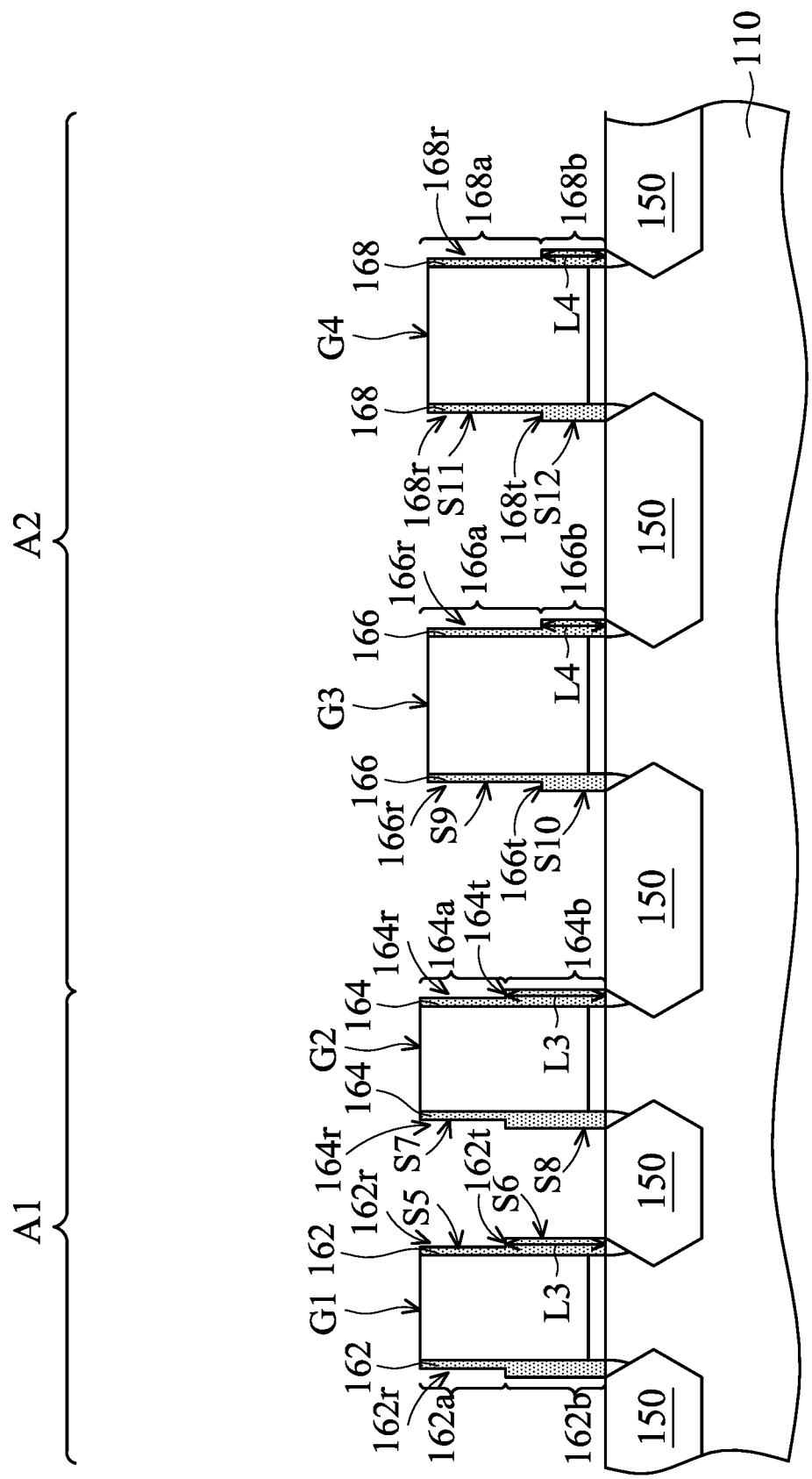
Figure 1L:
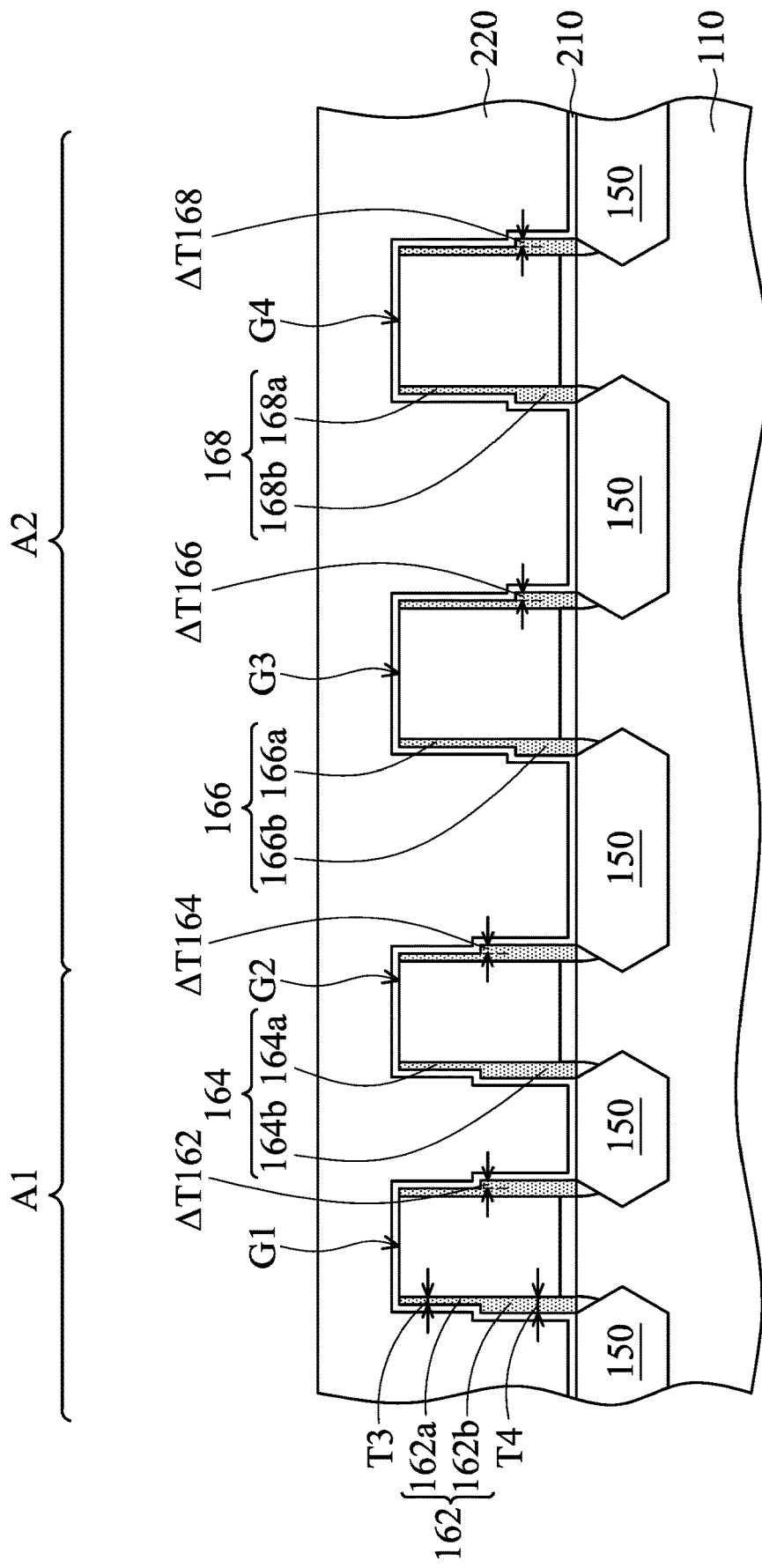
Figure 1M:
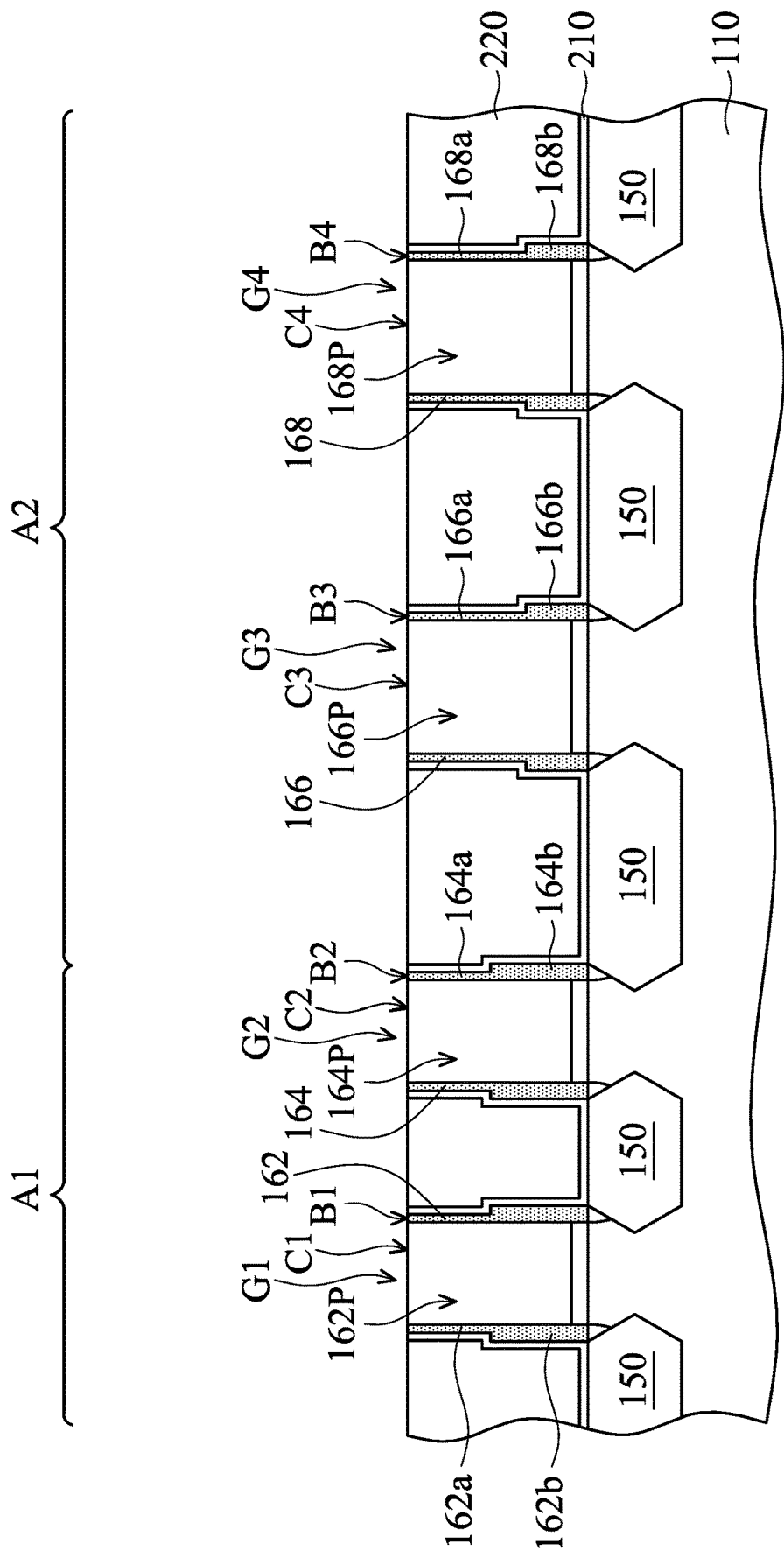
Figure 1N:
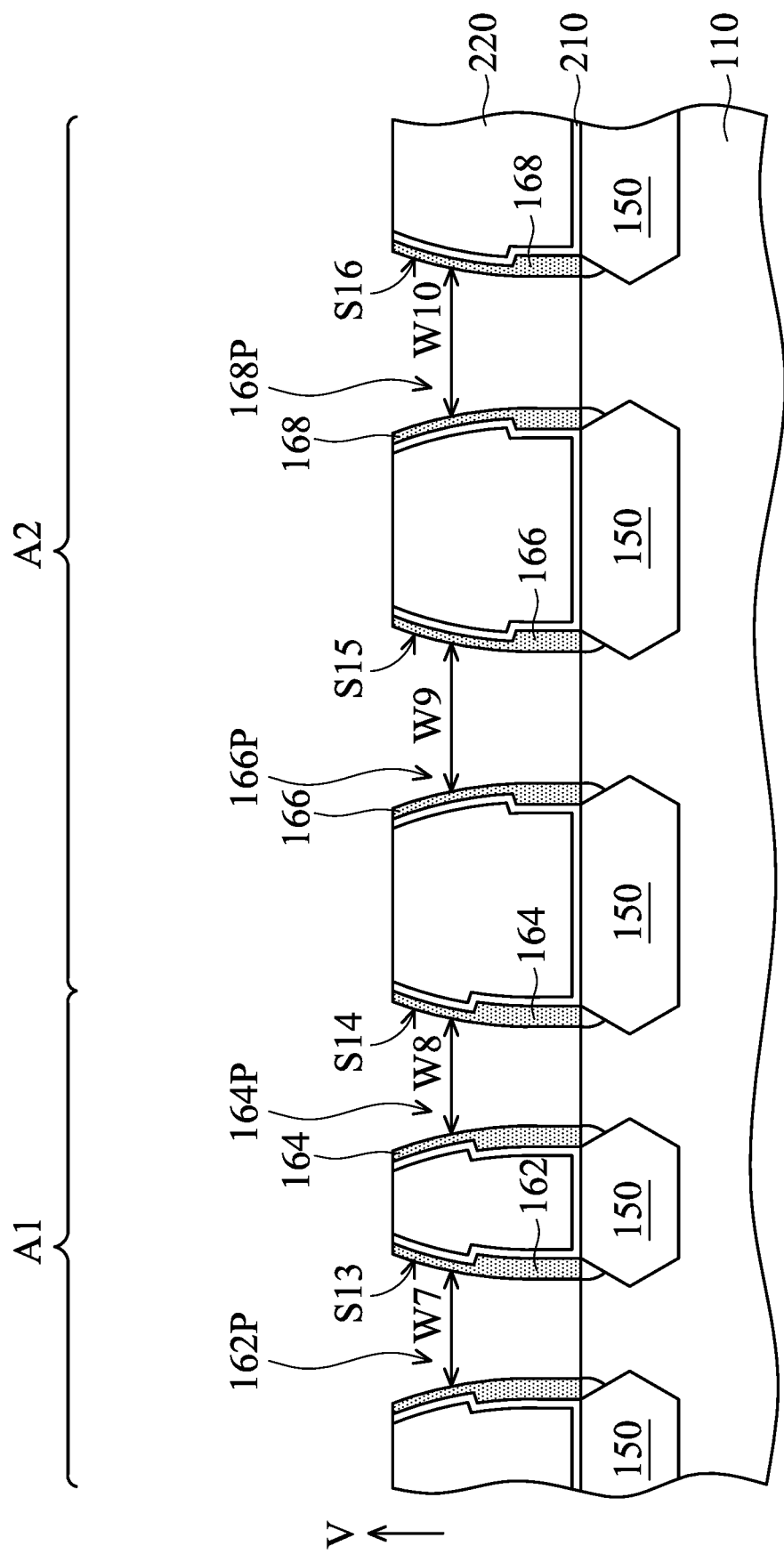
Figure 1O:
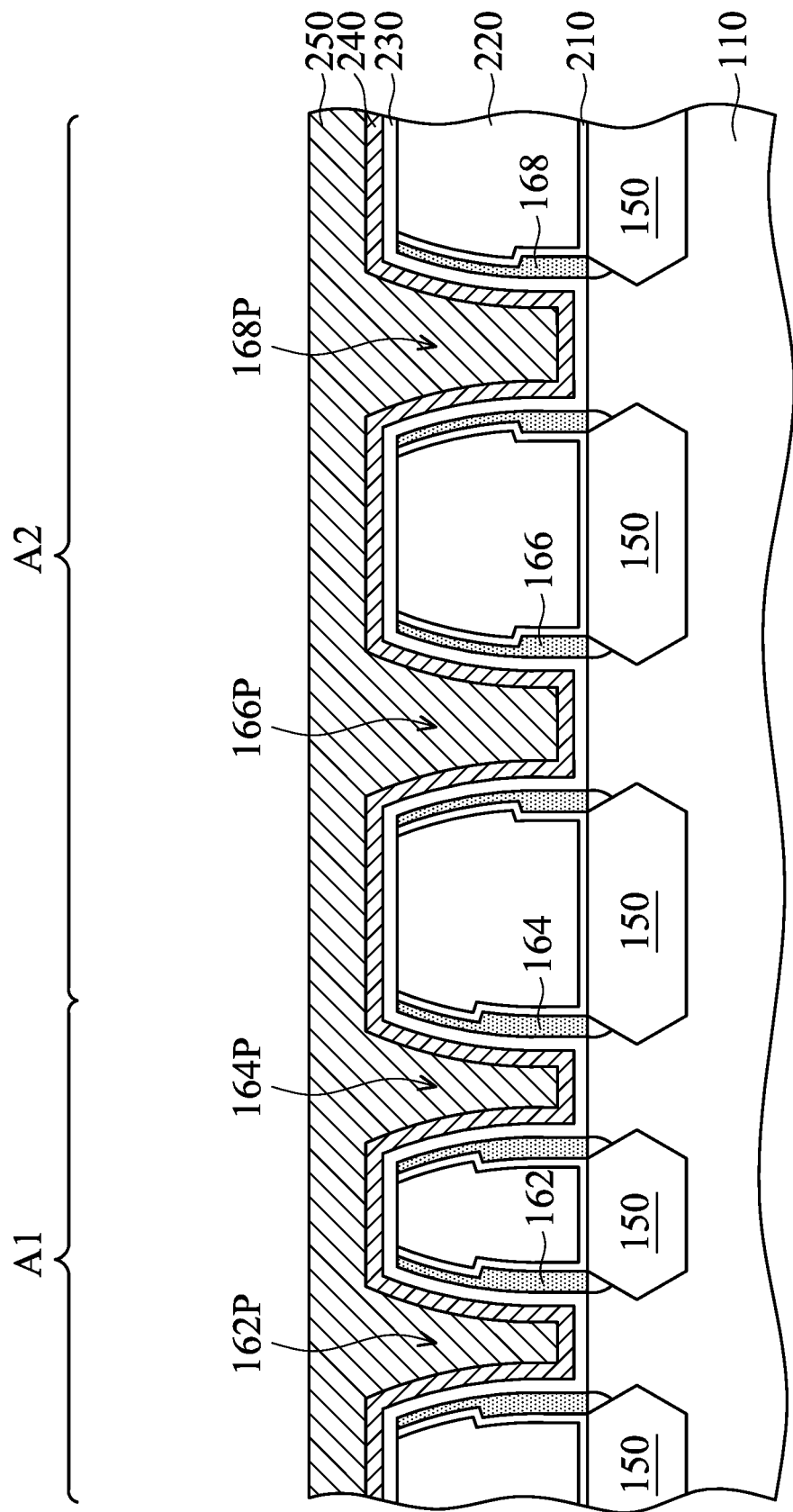
Figure 1P:
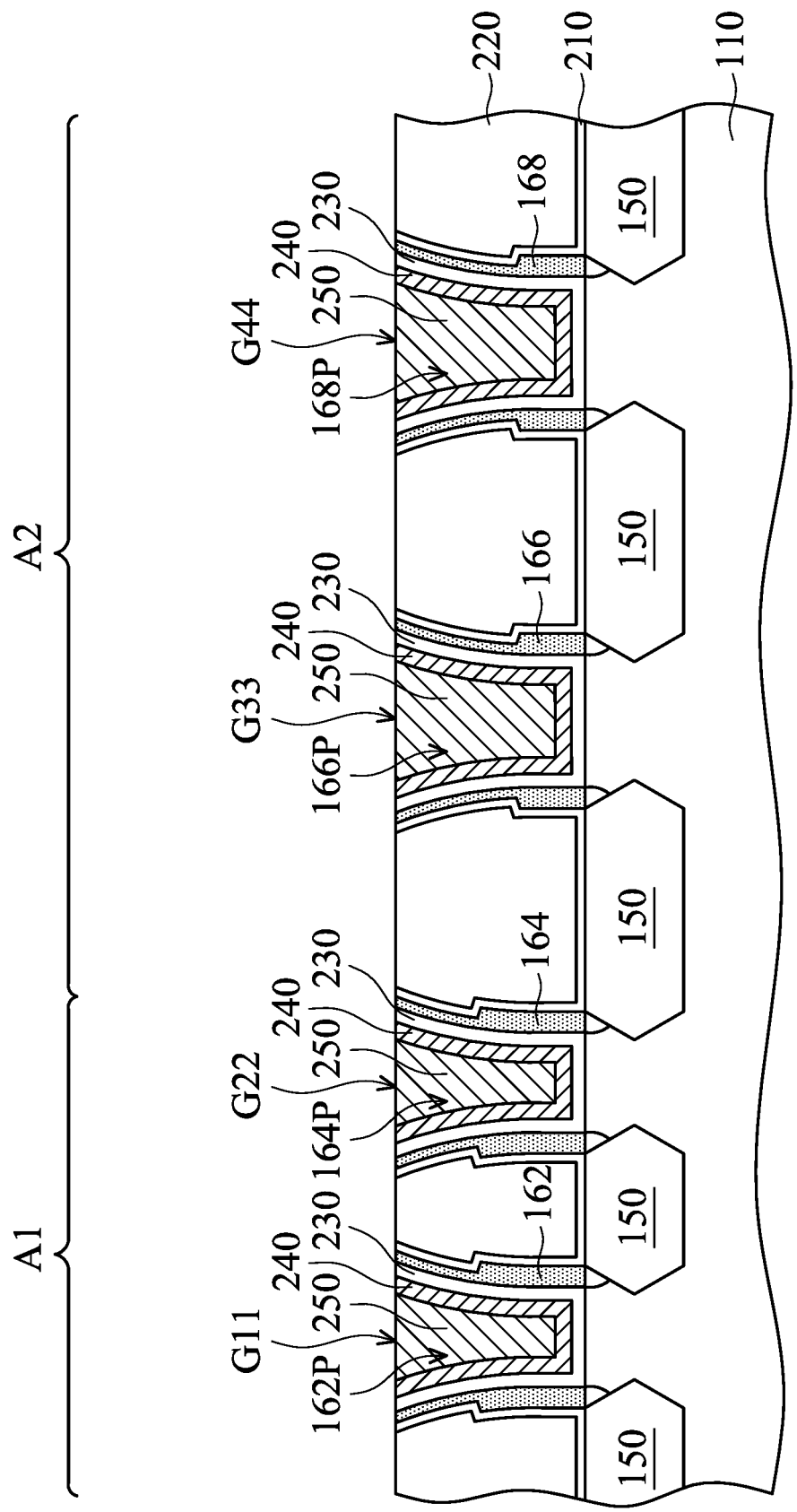
Figure 1Q:
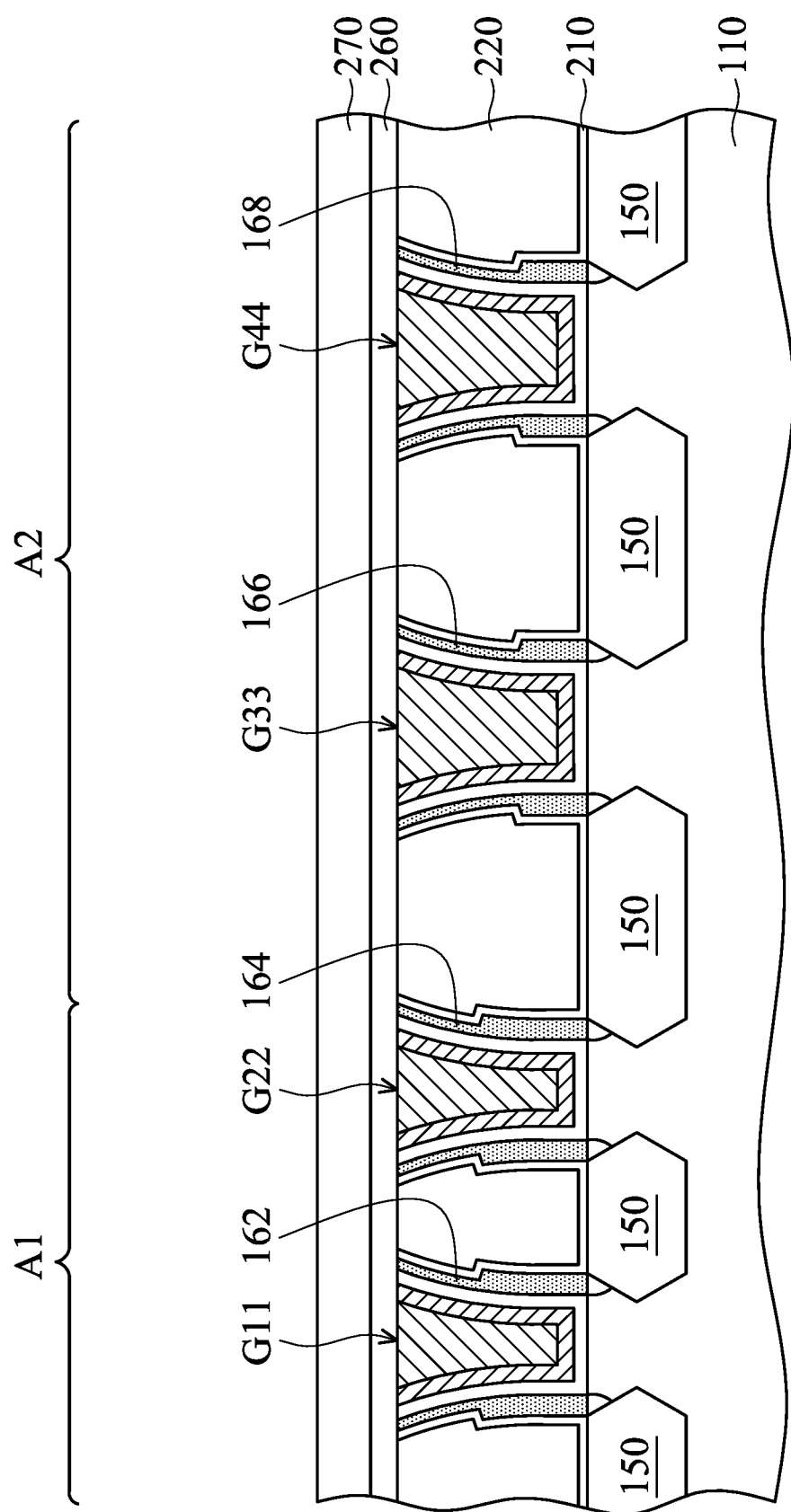
Figure 1R:
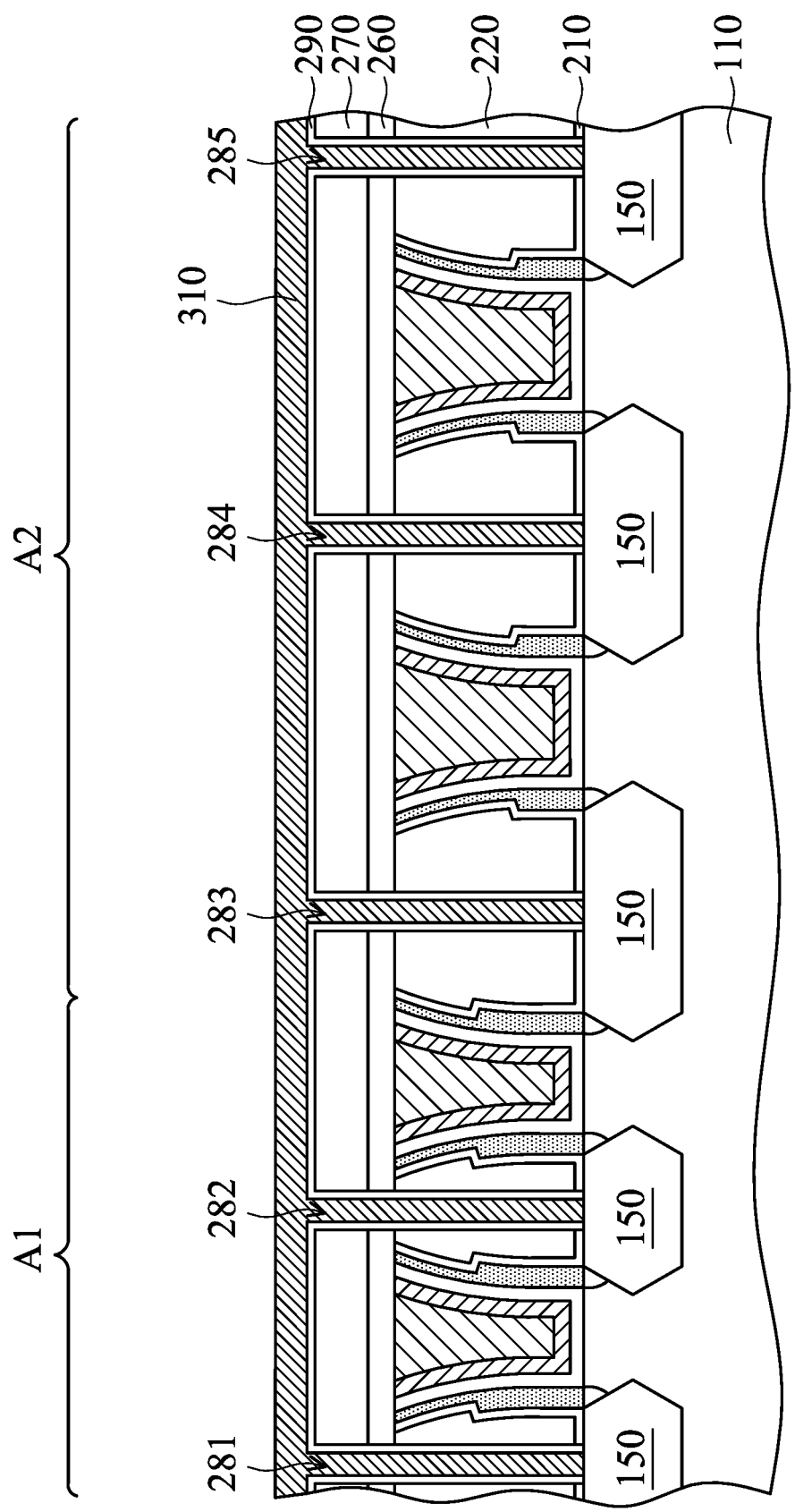
Figure 1S:
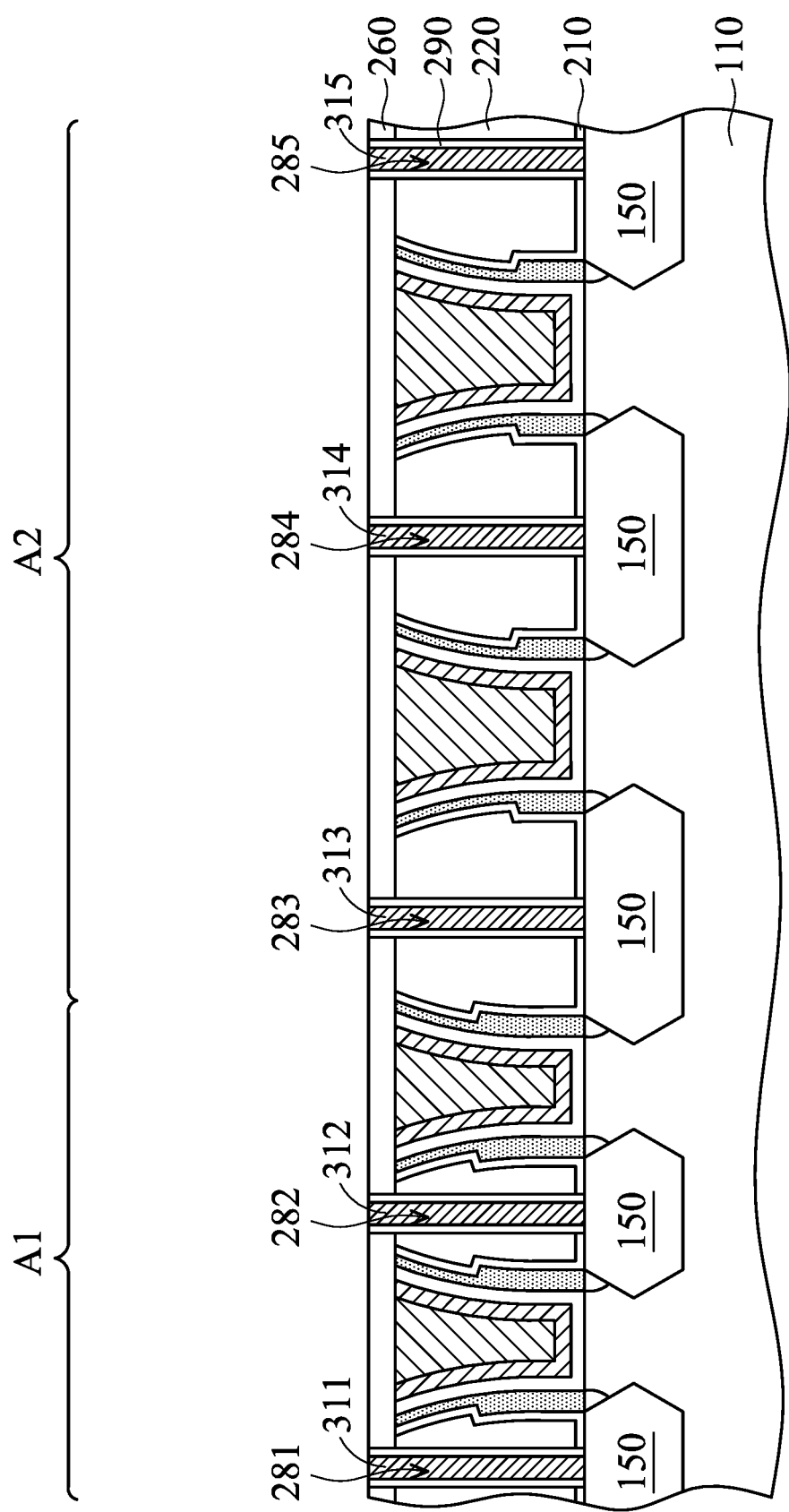
Figure 1T:
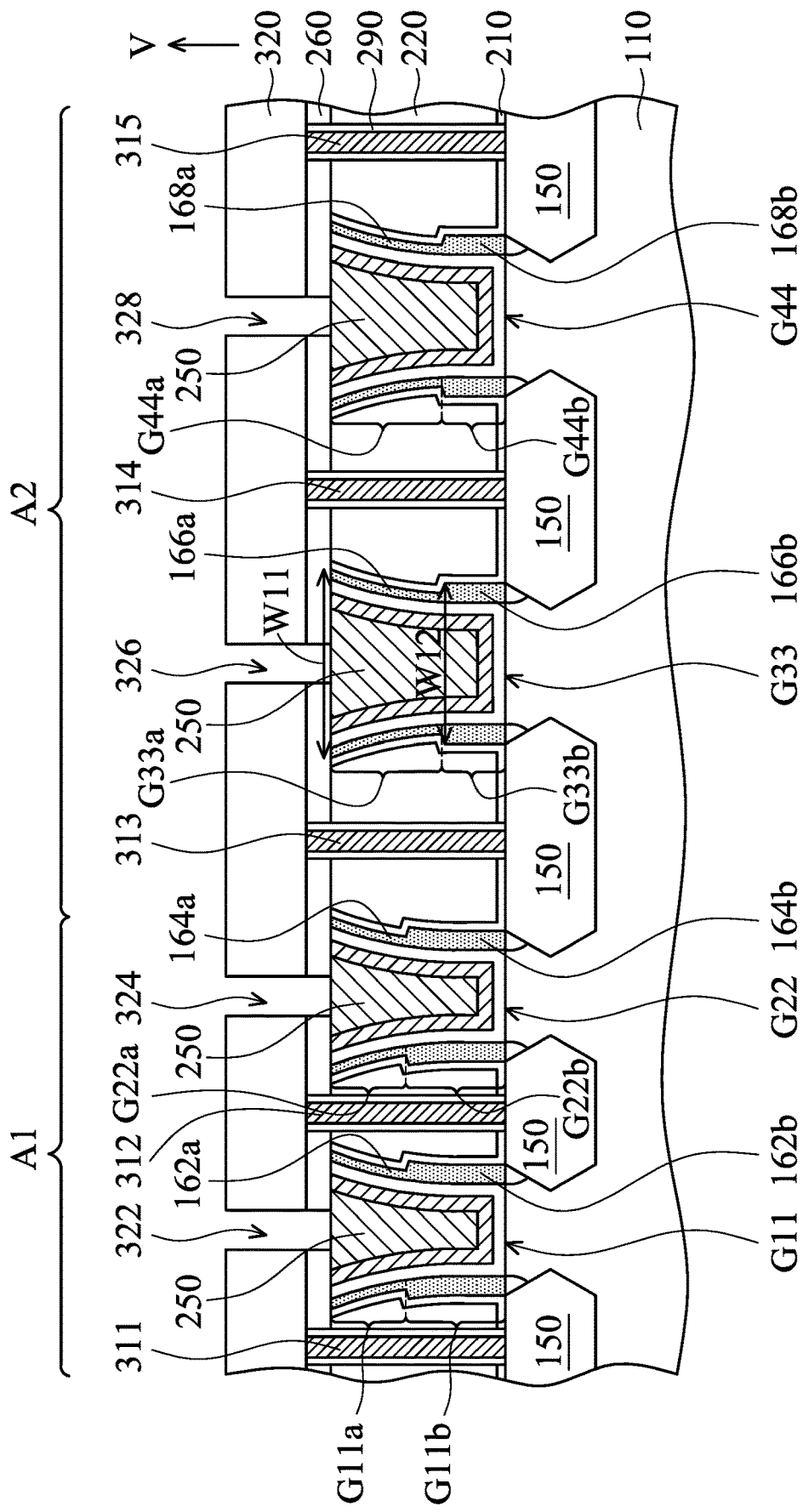
Figure 1U:
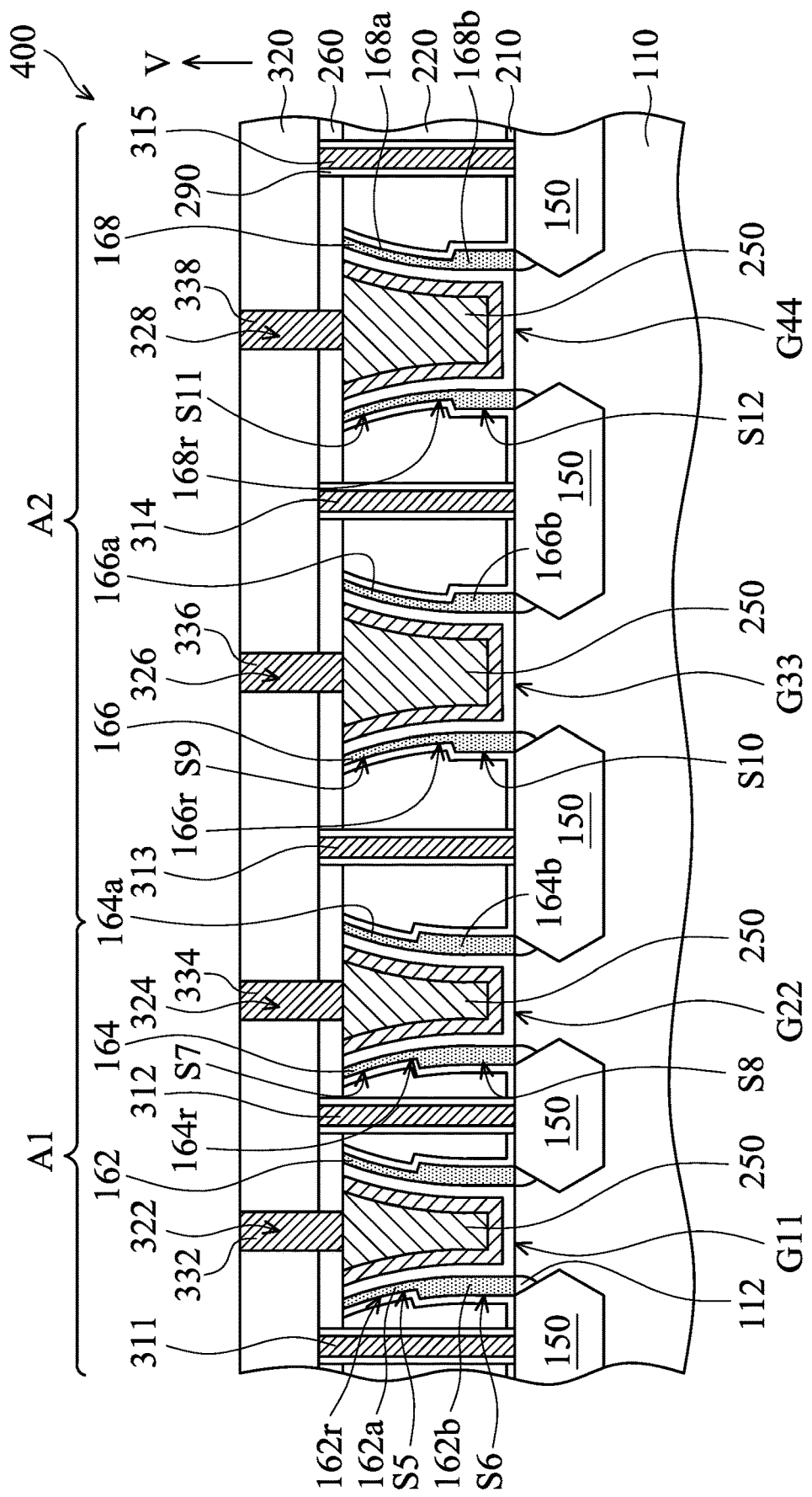

FIGS. 1A-1U are cross-sectional views of various stages of a process for forming a semiconductor device structure, in accordance with some embodiments. As shown in FIG. 1A, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

The semiconductor substrate 110 includes a first area A1 and a second area A2, in accordance with some embodiments. The average distance between the adjacent devices formed in the first area A1 is less than the average distance between the adjacent devices formed in the second area A2, in accordance with some embodiments. The devices include gates, source regions, or drain regions, in accordance with some embodiments. The first area A1 and the second area A2 are also referred to as a device dense area and a device loose area, in accordance with some embodiments.

As shown in FIG. 1A, a gate dielectric material layer 120a is deposited over the semiconductor substrate 110, in accordance with some embodiments. The gate dielectric material layer 120a is made of silicon oxide, in accordance with some embodiments. The gate dielectric material layer 120a is deposited using a chemical vapor deposition process (CVD process), in accordance with some embodiments.

As shown in FIG. 1A, a gate material layer 130a is deposited over the gate dielectric material layer 120a, in accordance with some embodiments. The gate material layer 130a is made of polysilicon, in accordance with some embodiments. The gate material layer 130a is deposited using a chemical vapor deposition process, in accordance with some embodiments.

As shown in FIG. 1A, a mask layer 140 is formed over the gate material layer 130a, in accordance with some embodiments. The mask layer 140 exposes a portion of the gate material layer 130a, in accordance with some embodiments. The mask layer 140 has strip portions 142, 144, 146, and 148, in accordance with some embodiments. The strip portions 142, 144, 146, and 148 are spaced apart from each other, in accordance with some embodiments. The strip portions 142 and 144 are located in the first area A1, in accordance with some embodiments. The strip portions 146 and 148 are located in the second area A2, in accordance with some embodiments.

In some embodiments, the mask layer 140 includes oxide or nitride, such as silicon oxide, silicon oxynitride, silicon nitride, or the like. The mask layer 140 is formed by a depositing process (such as a chemical vapor deposition process), a photolithography process, and an etching process, in accordance with some embodiments.

As shown in FIG. 1B, the gate material layer 130a exposed by the mask layer 140 is removed, and the gate dielectric material layer 120a under the removed gate material layer 130a is also removed, in accordance with some embodiments. The gate material layer 130a and the gate dielectric material layer 120a remaining under the strip portion 142 form a gate electrode 132 and a gate dielectric layer 122, in accordance with some embodiments. The gate electrode 132 and the gate dielectric layer 122 together form a gate stack G1, in accordance with some embodiments.

The gate material layer 130a and the gate dielectric material layer 120a remaining under the strip portion 144 form a gate electrode 134 and a gate dielectric layer 124, in accordance with some embodiments. The gate electrode 134 and the gate dielectric layer 124 together form a gate stack G2, in accordance with some embodiments.

The gate material layer 130a and the gate dielectric material layer 120a remaining under the strip portion 146 form a gate electrode 136 and a gate dielectric layer 126, in accordance with some embodiments. The gate electrode 136 and the gate dielectric layer 126 together form a gate stack G3, in accordance with some embodiments.

The gate material layer 130a and the gate dielectric material layer 120a remaining under the strip portion 148 form a gate electrode 138 and a gate dielectric layer 128, in accordance with some embodiments. The gate electrode 138 and the gate dielectric layer 128 together form a gate stack G4, in accordance with some embodiments. The average width of the gate stack G3 or G4 is greater than the average width of the gate stack G1 or G2, in accordance with some embodiments. The strip portions 142, 144, 146, and 148 are located over top surfaces of the gate stacks G1, G2, G3, and G4, in accordance with some embodiments.

The gate stack G2 is located between the gate stacks G1 and G3, in accordance with some embodiments. The gate stack G3 is located between the gate stacks G2 and G4, in accordance with some embodiments. A distance D1 between the gate stacks G1 and G2 is less than a distance D2 between the gate stacks G2 and G3, in accordance with some embodiments. The distance D1 is less than a distance D3 between the gate stacks G3 and G4, in accordance with some embodiments. The distance D2 is close to or equal to the distance D3, in accordance with some embodiments.

The removal process of the gate material layer 130a further removes a portion of the mask layer 140, in accordance with some embodiments. Therefore, top surfaces 142a, 144a, 146a, and 148a of the strip portions 142, 144, 146, and 148 are curved top surfaces, in accordance with some embodiments.

As shown in FIG. 1B, lightly doped regions 112 are formed in the semiconductor substrate 110 by using a suitable process, such as an ion implantation process. The ion implantation process may use the gate stacks G1, G2, G3, and G4 as a mask, and the lightly doped regions 112 are located at two opposite sides of each of the gate stacks G1, G2, G3, and G4, in accordance with some embodiments. The lightly doped regions 112 may be a lightly doped source region and a lightly doped drain (LDD) region. The dopants used in the ion implantation process may include boron or phosphorous.

As shown in FIG. 1B, portions of the semiconductor substrate 110 are removed to form recesses 114 at the two opposite sides of each of the gate stacks G1, G2, G3, and G4, in accordance with some embodiments. The recesses 114 are formed by a dry etching process and/or a wet etching process, in accordance with some embodiments.

As shown in FIG. 1B, stressors 150 are formed in the recesses 114, in accordance with some embodiments. In some embodiments, the stressors 150 include a p-type semiconductor material. For example, the stressors 150 may include epitaxially grown silicon germanium. In some other embodiments, the stressors 150 include an n-type semiconductor material. The stressors 150 may include epitaxially grown silicon, epitaxially grown silicon carbide (SiC), epitaxially grown silicon phosphide (SiP), or another suitable epitaxially grown semiconductor material. The lightly doped regions 112 and the stressors 150 are also referred to as source/drain structures, in accordance with some embodiments. The source/drain structure refers to a source structure or a drain structure, in accordance with some embodiments.

In some embodiments, the stressors 150 are formed by using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the stressors 150 may use gaseous and/or liquid precursors, which may interact with the semiconductor substrate 110.

In some embodiments, the stressors 150 are doped with one or more suitable dopants. For example, the stressors 150 are p-type source/drain features doped with boron (B) or another suitable dopant. Alternatively, the stressors 150 are n-type source/drain features doped with phosphor (P), antimony (Sb), or another suitable dopant. In some embodiments, the stressors 150 are doped in-situ during the growth of the stressors 150.

In some other embodiments, the stressors 150 are not doped during the growth of the stressors 150. After the formation of the stressors 150, the stressors 150 are doped in a subsequent process. In some embodiments, the doping is achieved by using an ion implantation process, a plasma immersion ion implantation process, a gas and/or solid source diffusion process, another applicable process, or a combination thereof. In some embodiments, the stressors 150 are further exposed to annealing processes to activate the dopants. For example, a rapid thermal annealing process is performed.

In some embodiments, a spacer material layer (not shown) is deposited over the semiconductor substrate 110, in accordance with some embodiments. The spacer material layer covers the stressors 150, the gate stacks G1, G2, G3, and G4, and the mask layer 140, in accordance with some embodiments. The spacer material layer has a uniform thickness, in accordance with some embodiments. The spacer material layer includes an insulating material, such as silicon oxide or silicon nitride. The spacer material layer is formed using a chemical vapor deposition process, in accordance with some embodiments.

As shown in FIG. 1B, the spacer material layer over the stressors 150 and the top surfaces 142a, 144a, 146a, and 148a of the strip portions 142, 144, 146, and 148 are removed, in accordance with some embodiments. The spacer material layer remaining over sidewalls of the strip portion 142 and the gate stack G1 forms a spacer layer 162, in accordance with some embodiments. The spacer layer 162 continuously surrounds the strip portion 142 and the gate stack G1, in accordance with some embodiments.

The spacer material layer remaining over sidewalls of the strip portion 144 and the gate stack G2 forms a spacer layer 164, in accordance with some embodiments. The spacer layer 164 continuously surrounds the strip portion 144 and the gate stack G2, in accordance with some embodiments. The spacer material layer remaining over sidewalls of the strip portion 146 and the gate stack G3 forms a spacer layer 166, in accordance with some embodiments. The spacer layer 166 continuously surrounds the strip portion 146 and the gate stack G3, in accordance with some embodiments.

The spacer material layer remaining over sidewalls of the strip portion 148 and the gate stack G4 forms a spacer layer 168, in accordance with some embodiments. The spacer layer 168 continuously surrounds the strip portion 148 and the gate stack G4, in accordance with some embodiments. The spacer layers 162, 164, 166, and 168 are configured to electrically isolate the gate electrodes 132, 134, 136, and 138 from one another, in accordance with some embodiments. The removal process includes an anisotropic etching process, such as a dry etching process, in accordance with some embodiments. In some other embodiments, the spacer layers 162, 164, 166, and 168 are formed firstly, and then the lightly doped regions 112 and the stressors 150 are formed.

As shown in FIG. 1C, a protective layer 170 is formed over the mask layer 140, the spacer layer 162, 164, 166, and 168, and the stressors 150, in accordance with some embodiments. The protective layer 170 conformally covers the mask layer 140, the spacer layers 162, 164, 166, and 168, and the stressors 150, in accordance with some embodiments. Therefore, the protective layer 170 has recesses 172, 174, and 176, in accordance with some embodiments.

The recess 172 is between the adjacent spacer layers 162 and 164 and between the strip portions 142 and 144, in accordance with some embodiments. The recess 174 is between the adjacent spacer layers 164 and 166 and between the strip portions 144 and 146, in accordance with some embodiments. The recess 176 is between the adjacent spacer layers 166 and 168 and between the strip portions 146 and 148, in accordance with some embodiments.

Since the distance D1 is less than the distance D2 and is less than the distance D3, the width W1 of the recess 172 is less than the width W2 of the recess 174 and is less than the width W3 of the recess 176, in accordance with some embodiments. The depths of the recesses 172, 174, and 176 are similar to each other, in accordance with some embodiments. Therefore, the aspect ratio of the recess 172 is greater than the aspect ratio of the recess 174 and is greater than the aspect ratio of the recess 176, in accordance with some embodiments.

The protective layer 170 is configured to protect the stressors 150 from damage during the subsequent processes, in accordance with some embodiments. The protective layer 170 includes an oxide material, such as a silicon oxide material, in accordance with some embodiments. The protective layer 170 includes an insulating material, in accordance with some embodiments. The protective layer 170 is formed using a deposition process, such as a chemical vapor deposition process or a physical vapor deposition process, in accordance with some embodiments.

As shown in FIG. 1D, a mask layer 180 is formed over the protective layer 170, in accordance with some embodiments. The mask layer 180 is filled into the recesses 172, 174, and 176, in accordance with some embodiments. Since the width W1 is less than both the widths W2 and W3, the mask layer 180 filled in the recess 172 is less than the mask layer 180 filled in the recess 174 or 176, in accordance with some embodiments.

Therefore, the mask layer 180 over the recess 172 (or the mask layer 180 in the first area A1) is thicker than the mask layer 180 over the recesses 174 and 176 (or the mask layer 180 in the second area A2), in accordance with some embodiments. Therefore, there is a thickness difference $\Delta T180$ between the mask layer 180 in the first area A1 and the mask layer 180 in the second area A2, in accordance with some embodiments. The mask layer 180 is formed using a coating process, in accordance with some embodiments. The mask layer 180 includes a photoresist material, in accordance with some embodiments. The mask layer 180 includes an insulating material, in accordance with some embodiments.

As shown in FIG. 1E, an upper portion of the mask layer 180 is removed, in accordance with some embodiments. After the removal process, the mask layer 180 is over lower portions 170b of the protective layer 170, in accordance with some embodiments. The mask layer 180 exposes upper portions 170a of the protective layer 170, in accordance with some embodiments. The upper portions 170a are over the mask layer 140 and upper portions U1, U2, U3, and U4 of the sidewalls S1, S2, S3, and S4 of the gate stacks G1, G2, G3, and G4, in accordance with some embodiments.

After the removal process, the mask layer 180 in the recess 172 is thicker than the mask layer 180 in the recesses 174 and 176, in accordance with some embodiments. The removal process includes an etching back process, in accordance with some embodiments.

As shown in FIG. 1F, the protective layer 170 exposed by the mask layer 180 is removed, in accordance with some embodiments. Since the mask layer 180 in the recess 172 is thicker than the mask layer 180 in the recesses 174 and 176, the protective layer 170 over the spacer layers 162 and 164 has a length L1 greater than a length L2 of the protective layer 170 over the spacer layers 166 and 168, in accordance with some embodiments. The lengths L1 and L2 refer to the distance between the bottom surface to the top surface of the protective layer 170, in accordance with some embodiments. Therefore, the lengths L1 and L2 may also be referred to as heights.

The removal process further removes an upper portion of the mask layer 140, in accordance with some embodiments. Therefore, the thickness T1 of the mask layer 140 before the removal process is reduced to a thickness T2 after the removal process, in accordance with some embodiments. The removal process includes an etching process, such as a wet etching process, in accordance with some embodiments. As shown in FIG. 1F, the mask layer 180 is removed, in accordance with some embodiments.

As shown in FIG. 1F, gaps 101, 102, and 103 are formed, in accordance with some embodiments. The gap 101 is formed between the adjacent spacer layers 162 and 164 and between the strip portions 142 and 144, in accordance with some embodiments. The gap 102 is between the adjacent spacer layers 164 and 166 and between the strip portions 144 and 146, in accordance with some embodiments. The gap 103 is between the adjacent spacer layers 166 and 168 and between the strip portions 146 and 148, in accordance with some embodiments.

Since the upper portions of the protective layer 170 and the mask layer 140 are removed, the aspect ratio of the gap 101 is less than the aspect ratio of the recess 172 (as shown in FIG. 1D), in accordance with some embodiments. Similarly, the aspect ratio of the gap 102 is less than the aspect ratio of the recess 174 (as shown in FIG. 1D), in accordance with some embodiments.

The aspect ratio of the gap 103 is less than the aspect ratio of the recess 176 (as shown in FIG. 1D), in accordance with some embodiments. Since the aspect ratio of the gaps 101, 102, and 103 are less than the recesses 172, 174, and 176 respectively, a subsequently formed mask layer may be filled into the gaps 101, 102, and 103 more easily.

The gaps 101, 102, and 103 have widths W4, W5, and W6 respectively, in accordance with some embodiments. The width W4 is less than both the widths W5 and W6, in accordance with some embodiments. The width difference (W4-W1; $^{\Delta}$W) between the widths W4 and W1 is substantially equal to the width difference (W5-W2; $^{\Delta}$W) between the widths W5 and W2 or the width difference (W6-W3; $^{\Delta}$W) between the widths W6 and W3, in accordance with some embodiments.

The width difference ($^{\Delta}$SW) is substantially equal to two times the thickness of the protective layer 170, in accordance with some embodiments. Since the width W1 is less than both the widths W2 and W3, the ratio ($^{\Delta}$W/W1) is greater than both the ratio ($^{\Delta}$W/W2) and the ratio ($^{\Delta}$W/W3), in accordance with some embodiments.

Figure 2:
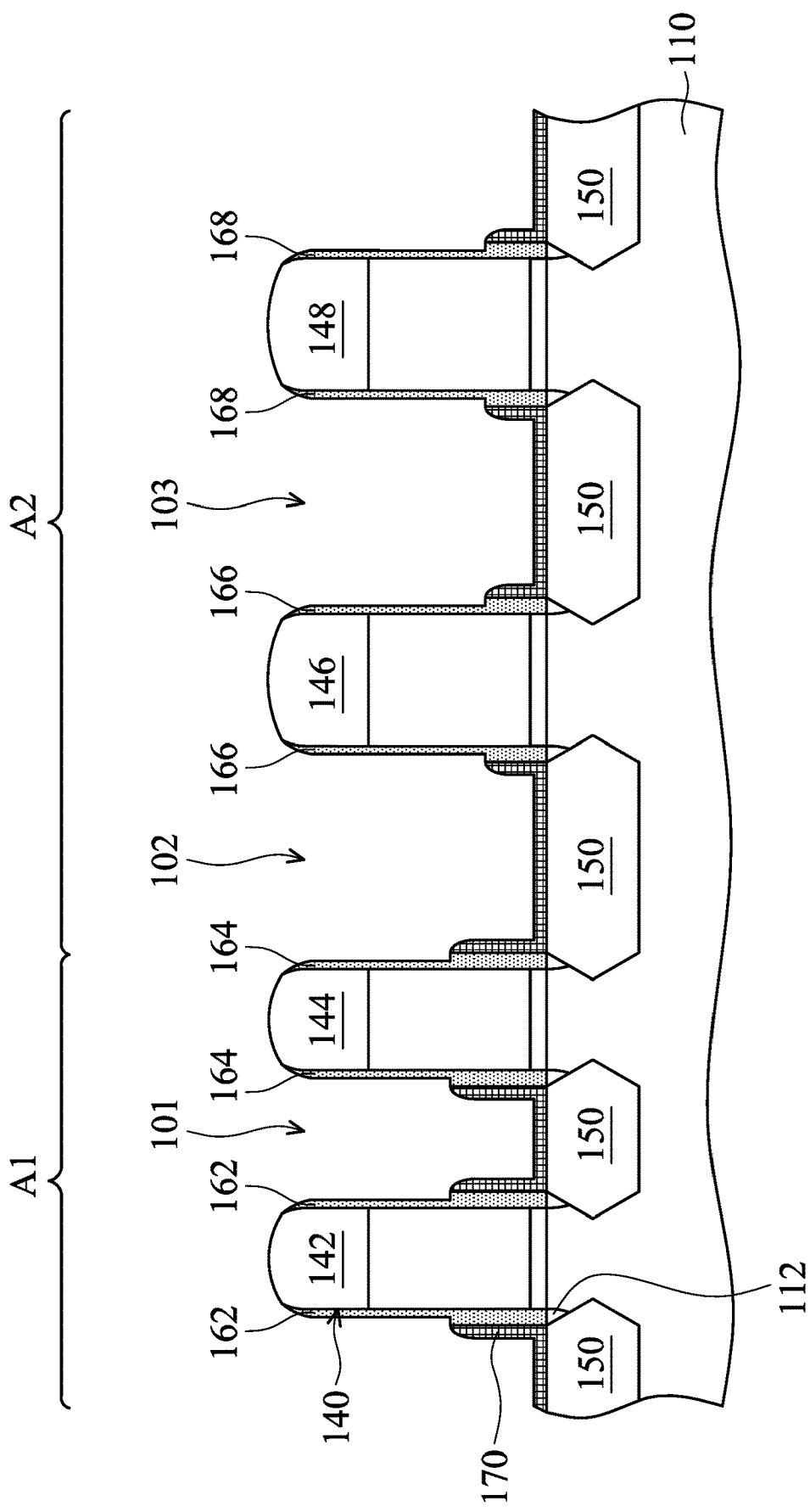
FIG. 2 is a cross-sectional views of a stage of a process for forming a semiconductor device structure, in accordance with some embodiments.

In some other embodiments, as shown in FIG. 2, the removal of the protective layer 170 further includes removing a portion of the spacer layers 162, 164, 166, and 168 under the removed protective layer 170. Therefore, the gaps 101, 102, and 103 are enlarged, in accordance with some embodiments.

As shown in FIG. 1G, a mask layer 190 is formed over the protective layer 170, the spacer layers 162, 164, 166, and 168, and the mask layer 140, in accordance with some embodiments. The mask layer 190 is filled into the gaps 101, 102, and 103, in accordance with some embodiments. Since the width W4 is less than both the widths W5 and W6, the mask layer 190 over the gap 101 is thicker than the mask layer 190 over the gaps 102 and 103.

Since the ratio ($^{\Delta}$W/W1) is greater than both the ratio ($^{\Delta}$W/W2) and the ratio ($^{\Delta}$W/W3), the thickness difference $^{\Delta}$T190 of the mask layer 190 is less than the thickness difference $^{\Delta}$T180 of the mask layer 180 (as shown in FIG. 1D), in accordance with some embodiments. Therefore, the removal of the upper portion of the protective layer 170 (as shown in FIG. 1F) reduces the loading effect of forming the mask layer 190, in accordance with some embodiments. As a result, the yield of the process for forming the mask layer 190 is improved, and the yield of the subsequent processes related to the mask layer 190 is improved as well, in accordance with some embodiments.

As shown in FIG. 1H, an upper portion of the mask layer 190 is removed, in accordance with some embodiments. After the removal process, the mask layer 190 exposes the strip portions 142, 144, 146, and 148 and the spacer layers 162, 164, 166, and 168 surrounding the strip portions 142, 144, 146, and 148 respectively, in accordance with some embodiments. After the removal process, the mask layer 190 in the gap 101 is thicker than the mask layer 190 in the gaps 102 and 103, in accordance with some embodiments. The mask layer 190 surrounds the gate stacks G1, G2, G3, and G4, in accordance with some embodiments. The removal process includes an etching back process, in accordance with some embodiments.

As shown in FIG. 1I, the strip portions 142, 144, 146, and 148 and the spacer layers 162, 164, 166, and 168 exposed by the mask layer 190 are removed, in accordance with some embodiments. Since the mask layer 190 has a thickness difference $^{\Delta}$T190, there is a thickness difference $^{\Delta}$T between the remaining gate stack G1 or G2 and the remaining gate stack G3 or G4, in accordance with some embodiments. Since the thickness difference $^{\Delta}$T190 is reduced by the removal of the upper portion of the protective layer 170 (as shown in FIG. 1F), the thickness difference $^{\Delta}$T is reduced as well, in accordance with some embodiments.

As shown in FIG. 1J, the mask layer 190 is removed, in accordance with some embodiments. As shown in FIG. 1K, the protective layer 170 is removed, in accordance with some embodiments. The removal process includes a wet etching process, in accordance with some embodiments.

The removal of the protective layer 170 further removes portions of the spacer layers 162, 164, 166, and 168 exposed by the protective layer 170, in accordance with some embodiments. The removal of the portions of the spacer layers 162, 164, 166, and 168 forms recesses 162r, 164r, 166r, and 168r in the spacer layers 162, 164, 166, and 168 respectively, in accordance with some embodiments.

After the removal process, the spacer layer 162 has an upper portion 162a and a lower portion 162b, in accordance with some embodiments. The upper portion 162a is thinner than the lower portion 162b, in accordance with some embodiments. The upper portion 162a is between the recess 162r and the gate stack G1, in accordance with some embodiments. The lower portion 162b is under the recess 162r, in accordance with some embodiments.

The upper portion 162a has an outer sidewall S5, in accordance with some embodiments. The lower portion 162b has an outer sidewall S6 and a top surface 162t, in accordance with some embodiments. The outer sidewall S5 is not aligned with the outer sidewall S6, in accordance with some embodiments. The top surface 162t connects the outer sidewall S5 to the outer sidewall S6, in accordance with some embodiments.

After the removal process, the spacer layer 164 has an upper portion 164a and a lower portion 164b, in accordance with some embodiments. The upper portion 164a is thinner than the lower portion 164b, in accordance with some embodiments. The upper portion 164a is between the recess 164r and the gate stack G2, in accordance with some embodiments. The lower portion 164b is under the recess 164r, in accordance with some embodiments.

The upper portion 164a has an outer sidewall S7, in accordance with some embodiments. The lower portion 164b has an outer sidewall S8 and a top surface 164t, in accordance with some embodiments. The outer sidewall S7 is not aligned with the outer sidewall S8, in accordance with some embodiments. The top surface 164t connects the outer sidewall S7 to the outer sidewall S8, in accordance with some embodiments.

After the removal process, the spacer layer 166 has an upper portion 166a and a lower portion 166b, in accordance with some embodiments. The upper portion 166a is thinner than the lower portion 166b, in accordance with some embodiments. The upper portion 166a is between the recess 166r and the gate stack G3, in accordance with some embodiments. The lower portion 166b is under the recess 166r, in accordance with some embodiments.

The upper portion 166a has an outer sidewall S9, in accordance with some embodiments. The lower portion 166b has an outer sidewall S10 and a top surface 166t, in accordance with some embodiments. The outer sidewall S9 is not aligned with the outer sidewall S10, in accordance with some embodiments. The top surface 166t connects the outer sidewall S9 to the outer sidewall S10, in accordance with some embodiments.

After the removal process, the spacer layer 168 has an upper portion 168a and a lower portion 168b, in accordance with some embodiments. The upper portion 168a is thinner than the lower portion 168b, in accordance with some embodiments. The upper portion 168a is between the recess 168r and the gate stack G4, in accordance with some embodiments. The lower portion 168b is under the recess 168r, in accordance with some embodiments.

The upper portion 168a has an outer sidewall S11, in accordance with some embodiments. The lower portion 168b has an outer sidewall S12 and a top surface 168t, in accordance with some embodiments. The outer sidewall S11 is not aligned with the outer sidewall S12, in accordance with some embodiments. The top surface 168t connects the outer sidewall S11 to the outer sidewall S12, in accordance with some embodiments.

Since the length L1 of the protective layer 170 over the spacer layers 162 and 164 is greater than the length L2 of the protective layer 170 over the spacer layers 166 and 168 (as shown in FIG. 1F), a length L3 of the lower portions 162b and 164b is greater than a length L4 of the lower portions 166b and 168b, in accordance with some embodiments. The lengths L3 and L4 refer to the distance between the bottom surface to the top surfaces 162t, 164t, 166t, and 168t of the spacer layers 162, 164, 166, and 168, in accordance with some embodiments. Therefore, the lengths L3 and L4 may also be referred to as heights.

As shown in FIG. 1L, a contact etch stop layer 210 is formed over the semiconductor substrate 110, in accordance with some embodiments. The contact etch stop layer 210 covers the stressors 150, the spacer layers 162, 164, 166, and 168, the gate stacks G1, G2, G3, and G4, and the semiconductor substrate 110, in accordance with some embodiments. The contact etch stop layer 210 includes a dielectric material, in accordance with some embodiments. The contact etch stop layer 210 includes silicon nitride, in accordance with some embodiments.

As shown in FIG. 1L, a dielectric layer 220 is deposited over the contact etch stop layer 210, in accordance with some embodiments. The dielectric layer 220 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 220 is deposited using a CVD process, a HDPCVD process, a spin-on process, a sputtering process, or a combination thereof, in accordance with some embodiments.

The upper portion 162a has a substantially uniform thickness T3, and the lower portion 162b has a substantially uniform thickness T4, in accordance with some embodiments. The difference $^\Delta$T162 between the thicknesses T3 and T4 ranges from about 1 nm to about 10 nm, in accordance with some embodiments. The thickness difference $^\Delta$T164 between the upper portion 164a and the lower portion 164b ranges from about 1 nm to about 10 nm, in accordance with some embodiments.

The thickness difference $^\Delta$T166 between the upper portion 166a and the lower portion 166b ranges from about 1 nm to about 10 nm, in accordance with some embodiments. The thickness difference $^\Delta$T168 between the upper portion 168a and the lower portion 168b ranges from about 1 nm to about 10 nm, in accordance with some embodiments.

As shown in FIG. 1M, a planarization process is performed over the dielectric layer 220 until top surfaces of the gate stacks G1, G2, G3, and G4 are exposed, in accordance with some embodiments. Top surfaces B1, B2, B3, and B4 of the upper portions 162a, 164a, 166a, and 168a and top surfaces C1, C2, C3, and C4 of the gate stacks G1, G2, G3, and G4 are aligned with each other, in accordance with some embodiments. The remaining dielectric layer 220 surrounds the spacer layers 162, 164, 166, and 168, in accordance with some embodiments.

Since the removal of the upper portion of the protective layer 170 (as shown in FIG. 1F) reduces the thickness difference ΔT between the gate stack G1 or G2 and the gate stack G3 or G4, the reduced thickness difference $^\Delta$T helps the planarization process to expose the top surfaces of the gate stacks G1, G2, G3, and G4, in accordance with some embodiments.

The spacer layers 162, 164, 166, and 168 have openings 162P, 164P, 166P, and 168P respectively, in accordance with some embodiments. The openings 162P, 164P, 166P, and 168P are trenches, in accordance with some embodiments. The gate stacks G1, G2, G3, and G4 are filled in the openings 162P, 164P, 166P, and 168P, in accordance with some embodiments. The planarization process includes a chemical mechanical polishing (CMP) process, in accordance with some embodiments. After the planarization process, the dielectric layer 220 has a substantially planar surface to facilitate subsequent process steps.

As shown in FIG. 1N, the gate stacks G1, G2, G3, and G4 are removed from the openings 162P, 164P, 166P, and 168P respectively, in accordance with some embodiments. The removal process for removing the gate stacks G1, G2, G3, and G4 includes a wet etching process, a dry etching process, or a combination thereof, in accordance with some embodiments.

In some embodiments, the dielectric layer 220 applies a tensile stress to the spacer layers 162, 164, 166, and 168, and therefore after the gate stacks G1, G2, G3, and G4 are removed, the openings 162P, 164P, 166P, and 168P are enlarged. Since the upper portions 162a, 164a, 166a, and 168a are thinner than the lower portions 162b, 164b, 166b, and 168b respectively, upper portions of the openings 162P, 164P, 166P, and 168P is wider than lower portions of the openings 162P, 164P, 166P, and 168P respectively.

The openings 162P, 164P, 166P, and 168P have widths W7, W8, W9, and W10 respectively, in accordance with some embodiments. Each of the widths W7, W8, W9, and W10 increases in a direction V away from the semiconductor substrate 110, in accordance with some embodiments. Therefore, subsequently formed films are easily deposited in the openings 162P, 164P, 166P, and 168P, in accordance with some embodiments. Each of the widths W7, W8, W9, and W10 continuously increases in the direction V, in accordance with some embodiments. The openings 162P, 164P, 166P, and 168P have inner curved sidewalls S13, S14, S15, and S16, in accordance with some embodiments.

As shown in FIG. 1O, a gate dielectric layer 230 is formed over the semiconductor substrate 110, in accordance with some embodiments. The gate dielectric layer 230 covers the openings 162P, 164P, 166P, and 168P, and top surfaces of the spacer layers 162, 164, 166, and 168, the contact etch stop layer 210, and the dielectric layer 220, in accordance with some embodiments.

The gate dielectric layer 230 includes a dielectric material, such as a high dielectric constant (high-k) material. The high-k material is made of metal oxides, metal nitrides, metal silicates, transition metal-oxides, transition metal-nitrides, transition metal-silicates, oxynitrides of metals, other suitable materials, or a combination thereof, in accordance with some embodiments. The high-k material includes hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), or a combination thereof.

The gate dielectric layer 230 is deposited using any suitable process, such as atomic layer deposition (ALD), chemical vapor deposition (CVD), physical vapor deposition (PVD), sputtering, plating, another suitable process, or a combination thereof, in accordance with some embodiments. In some embodiments, the gate dielectric layer 230 needs to be further annealed.

As shown in FIG. 1O, a work function metal layer 240 is deposited over the gate dielectric layer 230, in accordance with some embodiments. The work function metal layer 240 provides a desired work function for transistors to enhance device performance including improved threshold voltage.

In the embodiments of forming a PMOS transistor, the work function metal layer 240 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments. For example, the p-type metal is made of titanium, titanium nitride, another suitable material, or a combination thereof.

On the other hand, in the embodiments of forming an NMOS transistor, the work function metal layer 240 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

The work function metal layer 240 is made of hafnium, zirconium, titanium, tantalum, aluminum, metal carbide (e.g., hafnium carbide, or zirconium carbide), aluminide, ruthenium, or a combination thereof, in accordance with some embodiments. The work function metal layer 240 is deposited using a PVD process, a CVD process, an ALD process, a plating process, another suitable method, or a combination thereof, in accordance with some embodiments.

As shown in FIG. 1O, a gate electrode layer 250 (also called a metal gate electrode layer) is deposited over the work function metal layer 240 to fill the openings 162P, 164P, 166P, and 168P, in accordance with some embodiments. The gate electrode layer 250 includes a suitable metal material, such as aluminum, tungsten, gold, platinum, cobalt, another suitable metal, an alloy thereof, or a combination thereof, in accordance with some embodiments. The gate electrode layer 250 is deposited using a PVD process, a CVD process, a plating process, the like, or a combination thereof, in accordance with some embodiments.

As shown in FIG. 1P, a planarization process is performed to remove the gate electrode layer 250, the work function metal layer 240, and the gate dielectric layer 230 outside of the openings 162P, 164P, 166P, and 168P, in accordance with some embodiments. The planarization process includes a chemical mechanical polishing (CMP) process or the like, in accordance with some embodiments.

The gate electrode layer 250, the work function metal layer 240, and the gate dielectric layer 230 in the opening 162P together form a gate stack G11 (i.e., a metal gate stack), in accordance with some embodiments. The gate stack G11 is surrounded by the spacer layer 162, in accordance with some embodiments. The gate electrode layer 250 remaining in the opening 162P serves as a metal gate electrode of the gate stack G11, in accordance with some embodiments.

The gate electrode layer 250, the work function metal layer 240, and the gate dielectric layer 230 in the opening 164P together form a gate stack G22 (i.e., a metal gate stack), in accordance with some embodiments. The gate stack G22 is surrounded by the spacer layer 164, in accordance with some embodiments. The gate electrode layer 250 remaining in the opening 164P serves as a metal gate electrode of the gate stack G22, in accordance with some embodiments.

The gate electrode layer 250, the work function metal layer 240, and the gate dielectric layer 230 in the opening 166P together form a gate stack G33 (i.e., a metal gate stack), in accordance with some embodiments. The gate stack G33 is surrounded by the spacer layer 166, in accordance with some embodiments. The gate electrode layer 250 remaining in the opening 166P serves as a metal gate electrode of the gate stack G33, in accordance with some embodiments.

The gate electrode layer 250, the work function metal layer 240, and the gate dielectric layer 230 in the opening 168P together form a gate stack G44 (i.e., a metal gate stack), in accordance with some embodiments. The gate stack G44 is surrounded by the spacer layer 168, in accordance with some embodiments. The gate electrode layer 250 remaining in the opening 168P serves as a metal gate electrode of the gate stack G44, in accordance with some embodiments. The average width of the gate stack G33 or G44 is greater than the average width of the gate stack G11 or G22, in accordance with some embodiments.

As shown in FIG. 1Q, an etching stop layer 260 (also called an insulating layer or a dielectric layer) is deposited over the top surfaces of the dielectric layer 220, the contact etch stop layer 210, the spacer layers 162, 164, 166, and 168, and the gate stacks G11, G22, G33, and G44, in accordance with some embodiments. The etching stop layer 260 is made of silicon nitride, in accordance with some embodiments. As shown in FIG. 1Q, a protective layer 270 is formed over the etching stop layer 260, in accordance with some embodiments. The protective layer 270 includes a plasma-enhanced oxide (PEOX) layer, in accordance with some embodiments.

As shown in FIG. 1R, portions of the protective layer 270, the etching stop layer 260, the dielectric layer 220, and the contact etch stop layer 210 are removed to form contact openings 281, 282, 283, 284, and 285, in accordance with some embodiments. The contact openings 281, 282, 283, 284, and 285 pass through the protective layer 270, the etching stop layer 260, the dielectric layer 220, and the contact etch stop layer 210 to expose the stressors 150, in accordance with some embodiments. The removal process includes performing a photolithography process and an etching process, in accordance with some embodiments.

As shown in FIG. 1R, a dielectric spacer liner (DSL) layer 290 is conformally deposited on the protective layer 270 and the sidewalls and the bottoms of the contact openings 281, 282, 283, 284, and 285, in accordance with some embodiments. The DSL layer 290 may be made of SiOC or other suitable materials. The DSL layer 290 is deposited by, for example, an atomic layer deposition process or other suitable processes. The DSL layer 290 over the bottoms of the contact openings 281, 282, 283, 284, and 285 is removed to expose the stressors 150, in accordance with some embodiments.

As shown in FIG. 1R, a conductive layer 310 is deposited over the DSL layer 290 and is filled into the openings 281, 282, 283, 284, and 285 to electrically contact with the stressors 150, in accordance with some embodiments. The conductive layer 310 is formed by, for example, a PVD process or other suitable processes. The conductive layer 310 is made of, for example, tungsten or other suitable conductive materials.

As shown in FIG. 1S, a planarization process is performed to remove the conductive layer 310 and the DSL layer 290 outside the openings 281, 282, 283, 284, and 285, and the protective layer 270, in accordance with some embodiments.

The planarization process includes a chemical mechanical polishing (CMP) process, in accordance with some embodiments. After the CMP process, the conductive layer 310 remaining in the openings 281, 282, 283, 284, and 285 forms contact structures 311, 312, 313, 314, and 315, in accordance with some embodiments. The contact structures 311, 312, 313, 314, and 315 are electrically connected to the stressors 150 respectively, in accordance with some embodiments. The contact structures 311, 312, 313, 314, and 315 include contact plugs, in accordance with some embodiments.

As shown in FIG. 1T, a dielectric layer 320 is deposited over the etching stop layer 260, the contact structures 311, 312, 313, 314, and 315, and the DSL layer 290, in accordance with some embodiments. The dielectric layer 320 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 320 is deposited using a CVD process, a HDPCVD process, a spin-on process, a sputtering process, or a combination thereof, in accordance with some embodiments.

As shown in FIG. 1T, portions of the etching stop layer 260 and the dielectric layer 320 are removed, in accordance with some embodiments. The removal process forms through holes 322, 324, 326, and 328 in the etching stop layer 260 and the dielectric layer 320, in accordance with some embodiments. The through holes 322, 324, 326, and 328 respectively expose the gate electrode layers 250 of the gate stacks G11, G22, G33, and G44, in accordance with some embodiments.

Since each of the widths W7, W8, W9, and W10 of the openings 162P, 164P, 166P, and 168P increases in the direction V (as shown in FIG. 1N), each of widths of the gate stacks G11, G22, G33, and G44 increases in the direction V as well, in accordance with some embodiments.

The gate stack G11 has an upper portion G11a and a lower portion G11b, in accordance with some embodiments. The upper portion G11a is wider than the lower portion G11b, in accordance with some embodiments. The upper portion 162a and the lower portion 162b surround the upper portion G11a and the lower portion G11b respectively, in accordance with some embodiments.

The gate stack G22 has an upper portion G22a and a lower portion G22b, in accordance with some embodiments. The upper portion G22a is wider than the lower portion G22b, in accordance with some embodiments. The upper portion 164a and the lower portion 164b surround the upper portion G22a and the lower portion G22b respectively, in accordance with some embodiments.

The gate stack G33 has an upper portion G33a and a lower portion G33b, in accordance with some embodiments. The upper portion G33a is wider than the lower portion G33b, in accordance with some embodiments. The upper portion 166a and the lower portion 166b surround the upper portion G33a and the lower portion G33b respectively, in accordance with some embodiments. The maximum width W11 of the upper portion G33a and the upper portion 166a is greater than the maximum width W12 of the lower portion G33b and the lower portion 166b, in accordance with some embodiments.

The gate stack G44 has an upper portion G44a and a lower portion G44b, in accordance with some embodiments. The upper portion G44a is wider than the lower portion G44b, in accordance with some embodiments. The upper portion 168a and the lower portion 168b surround the upper portion G44a and the lower portion G44b respectively, in accordance with some embodiments.

As shown in FIG. 1U, conductive via structures 332, 334, 336, and 338 are formed in the through holes 322, 324, 326, and 328 respectively, in accordance with some embodiments. The conductive via structures 332, 334, 336, and 338 are electrically connected to the gate electrode layers 250 of the gate stacks G11, G22, G33, and G44 respectively, in accordance with some embodiments.

Since the upper portions G11a, G22a, G33a, and G44a are wider than the lower portions G11b, G22b, G33b, and G44b respectively (as shown in FIG. 1T), the conductive via structures 332, 334, 336, and 338 are easily aligned with the upper portions G11a, G22a, G33a, and G44a respectively, in accordance with some embodiments. Therefore, misalignment of the conductive via structures 332, 334, 336, and 338 is prevented, in accordance with some embodiments. As a result, the yield of the process for forming the conductive via structures 332, 334, 336, and 338 is improved, in accordance with some embodiments.

As shown in FIG. 1U, after the formation of the conductive via structures 332, 334, 336, and 338, a semiconductor device structure 400 is substantially formed, in accordance with some embodiments. The semiconductor device structure 400 includes the semiconductor substrate 110, the gate stacks G11, G22, G33, and G44, the spacer layers 162, 164, 166, and 168, and the stressors 150, in accordance with some embodiments.

The semiconductor device structure 400 further includes the contact etch stop layer 210, the etching stop layer 260, the dielectric spacer liner (DSL) layer 290, the contact structures 311, 312, 313, 314, and 315, the dielectric layers 220 and 320, the conductive via structures 332, 334, 336, and 338, and the lightly doped regions 112, in accordance with some embodiments.

Figure 3A:
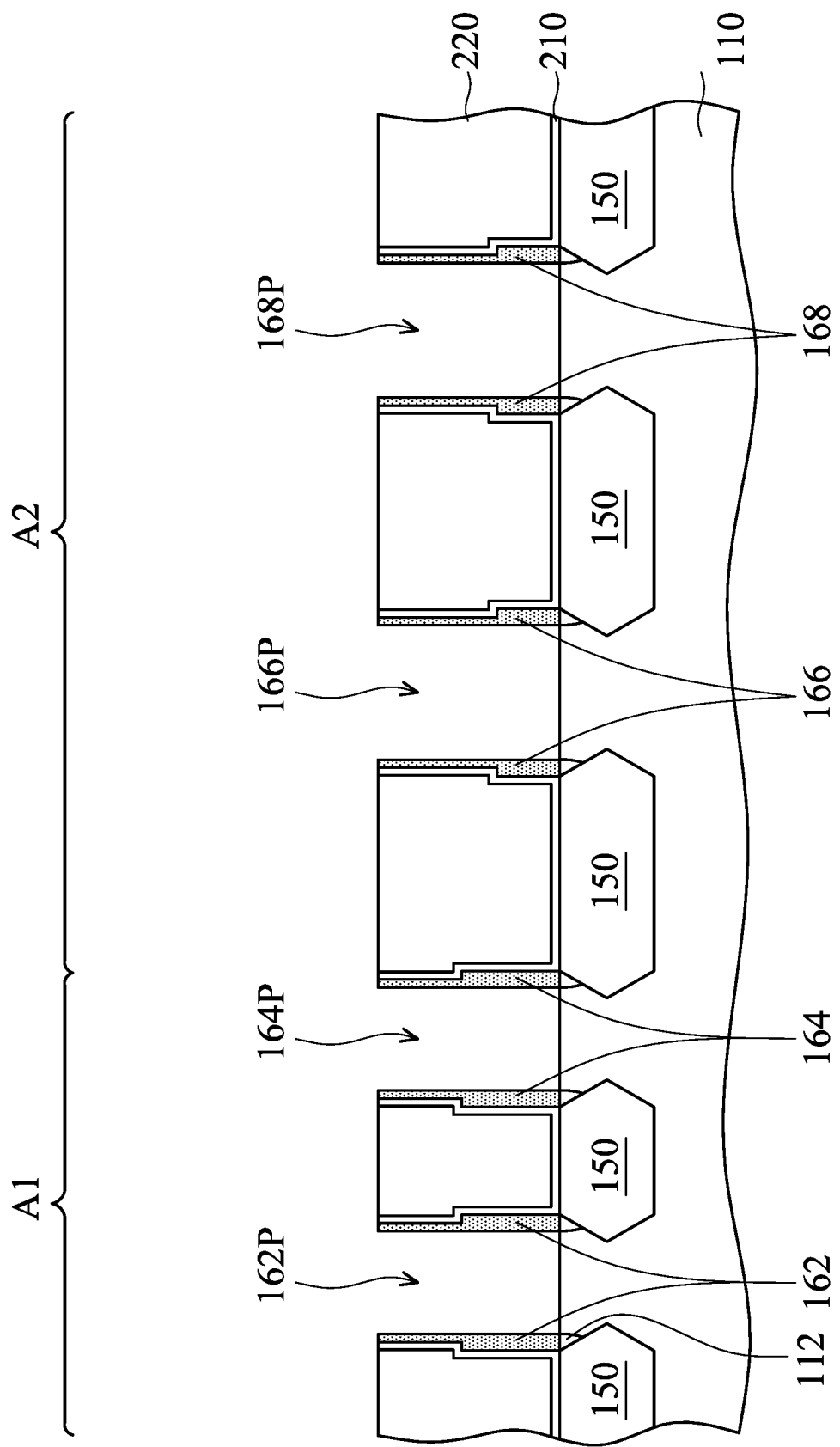
FIGS. 3A-3B are cross-sectional views of various stages of a process for forming a semiconductor device structure, in accordance with some embodiments.
Figure 3B:
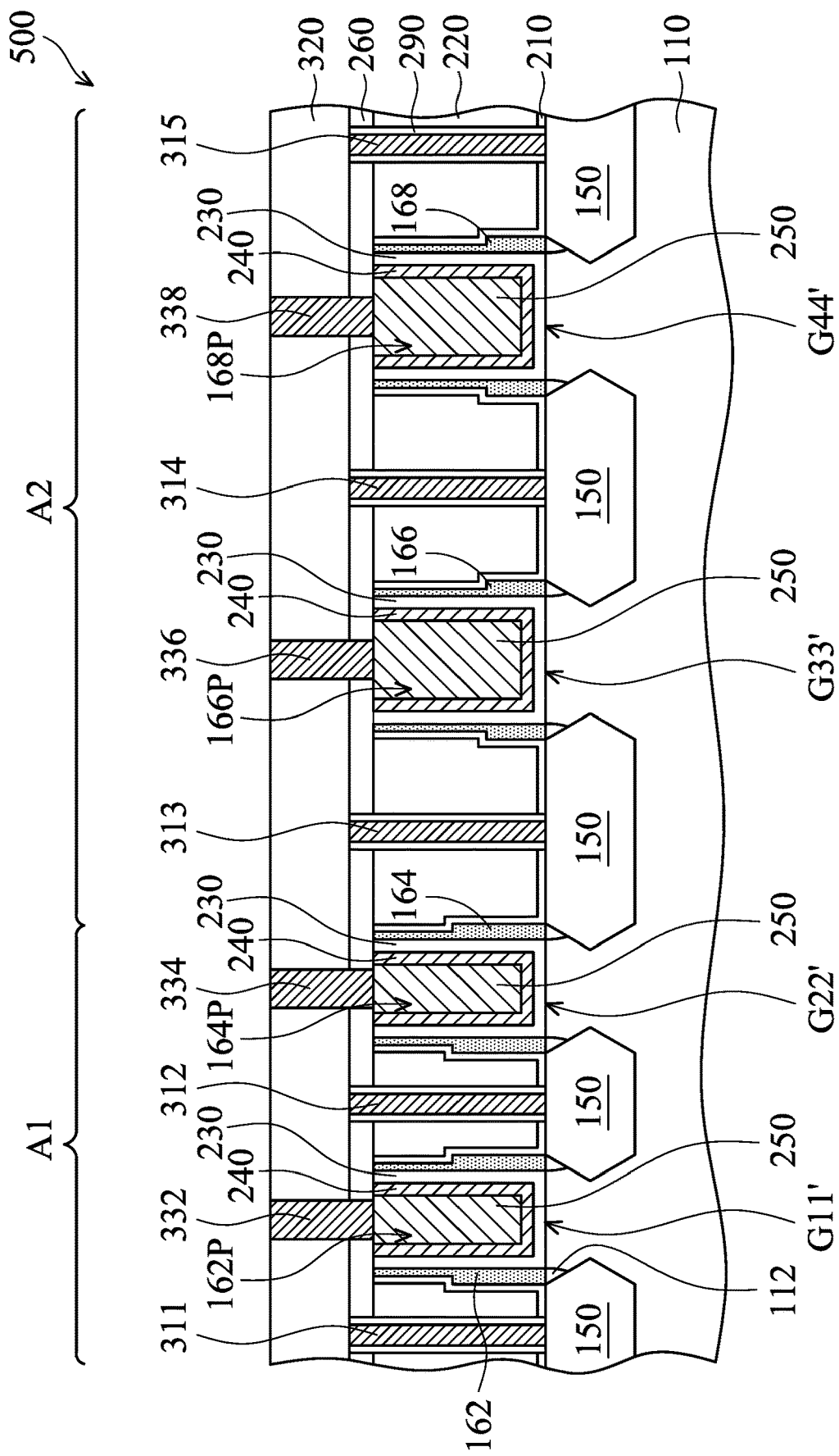

FIGS. 3A-3B are cross-sectional views of various stages of a process for forming a semiconductor device structure, in accordance with some embodiments. As shown in FIG. 3A, after the step of FIG. 1M, the gate stacks G1, G2, G3, and G4 are removed from the openings 162P, 164P, 166P, and 168P respectively, in accordance with some embodiments.

In some embodiments, since the stress of the dielectric layer 220 applied to the spacer layers 162, 164, 166, and 168 is able to be adjusted by adjusting annealing temperature, annealing time, and dopants of the dielectric layer 220, the openings 162P, 164P, 166P, and 168P are not enlarged.

As shown in FIG. 3B, after the steps of FIGS. 1P-1U, gate stacks G11', G22', G33', and G44', an etching stop layer 260, a dielectric spacer liner (DSL) layer 290, contact structures 311, 312, 313, 314, and 315, a dielectric layer 320, and conductive via structures 332, 334, 336, and 338 are formed, in accordance with some embodiments.

The structures and materials of the etching stop layer 260, the dielectric spacer liner (DSL) layer 290, the contact structures 311, 312, 313, 314, and 315, the dielectric layer 320, and the conductive via structures 332, 334, 336, and 338 in FIG. 3B are similar to or the same as that in FIG. 1U, in accordance with some embodiments.

The structures and materials of the gate stacks G11', G22', G33', and G44' in FIG. 3B are similar to that of the gate stacks G11, G22, G33, and G44 in FIG. 1U, except that each of the gate stacks G11', G22', G33', and G44' has a uniform width, in accordance with some embodiments.

As shown in FIG. 3B, after the formation of the conductive via structures 332, 334, 336, and 338, a semiconductor device structure 500 is substantially formed, in accordance with some embodiments. The semiconductor device structure 500 includes the semiconductor substrate 110, the gate stacks G11', G22', G33', and G44', the spacer layers 162, 164, 166, and 168, and the stressors 150, in accordance with some embodiments.

The semiconductor device structure 500 further includes the contact etch stop layer 210, the etching stop layer 260, the dielectric spacer liner (DSL) layer 290, the contact structures 311, 312, 313, 314, and 315, the dielectric layers 220 and 320, the conductive via structures 332, 334, 336, and 338, and the lightly doped regions 112, in accordance with some embodiments.

Figure 4A:
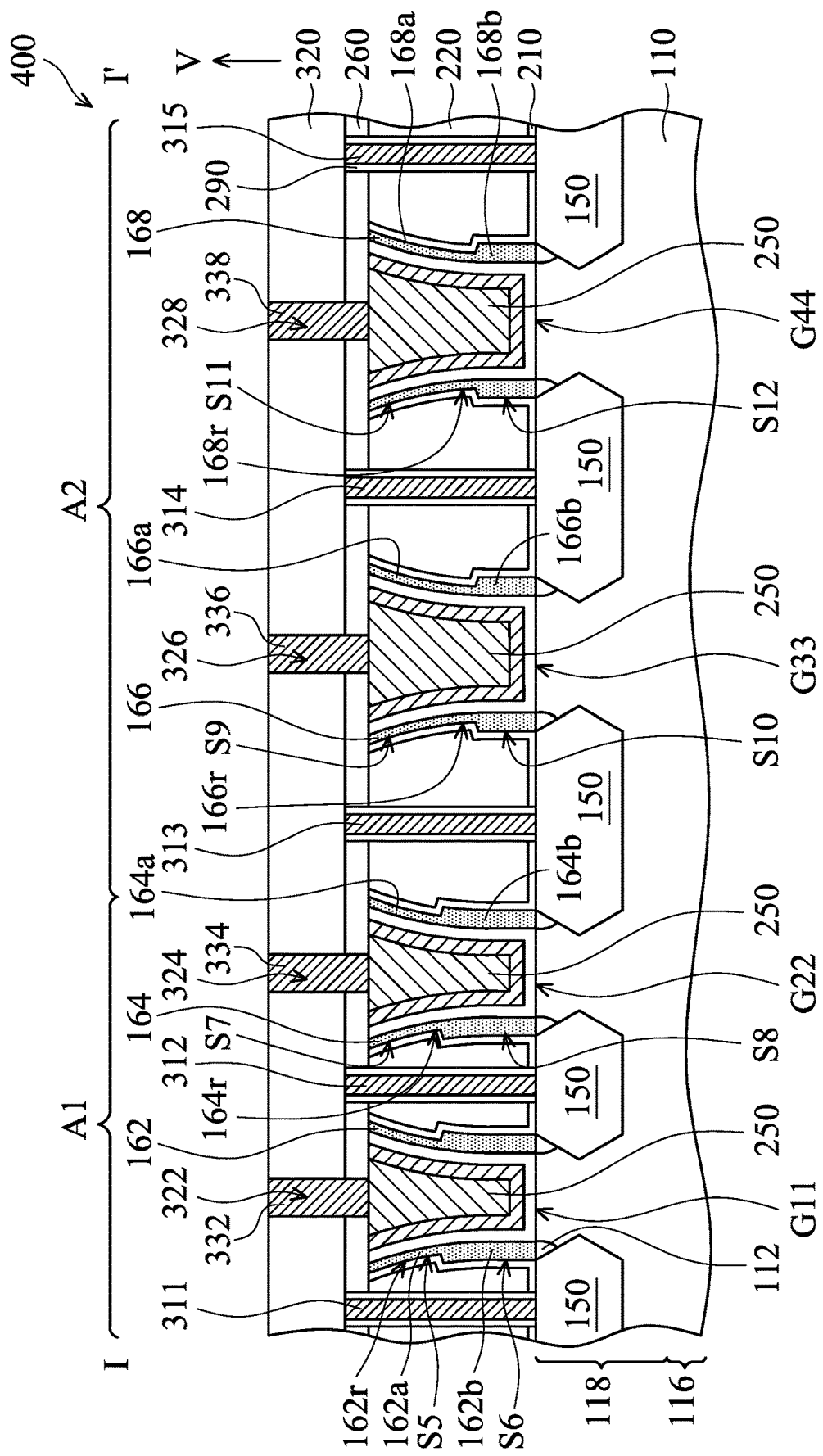
FIG. 4A is a cross-sectional view of a semiconductor device structure, in accordance with some embodiments.
Figure 4B:
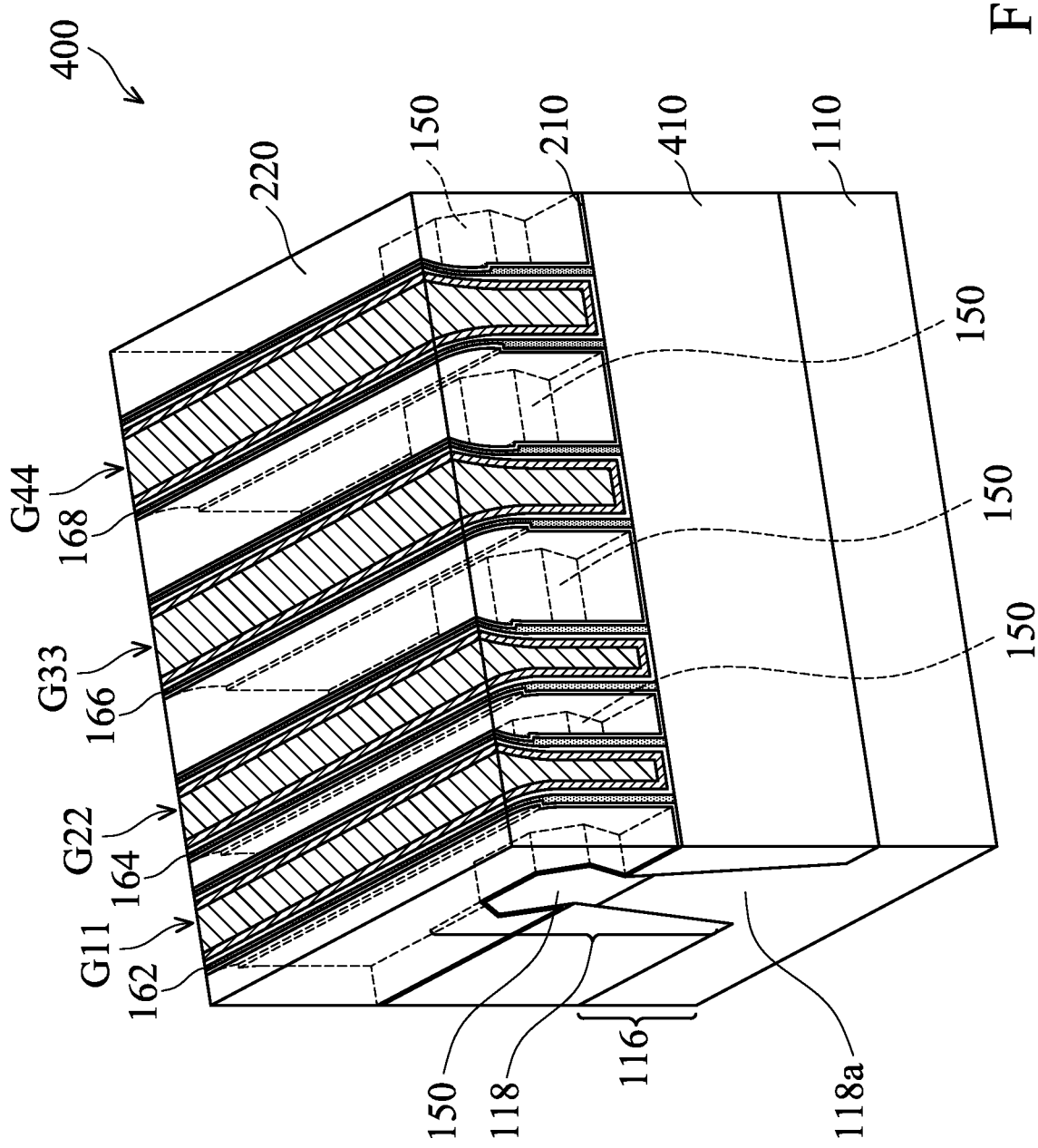
FIG. 4B is a perspective view of the semiconductor device structure of FIG. 4A, in accordance with some embodiments.
Figure 4C:
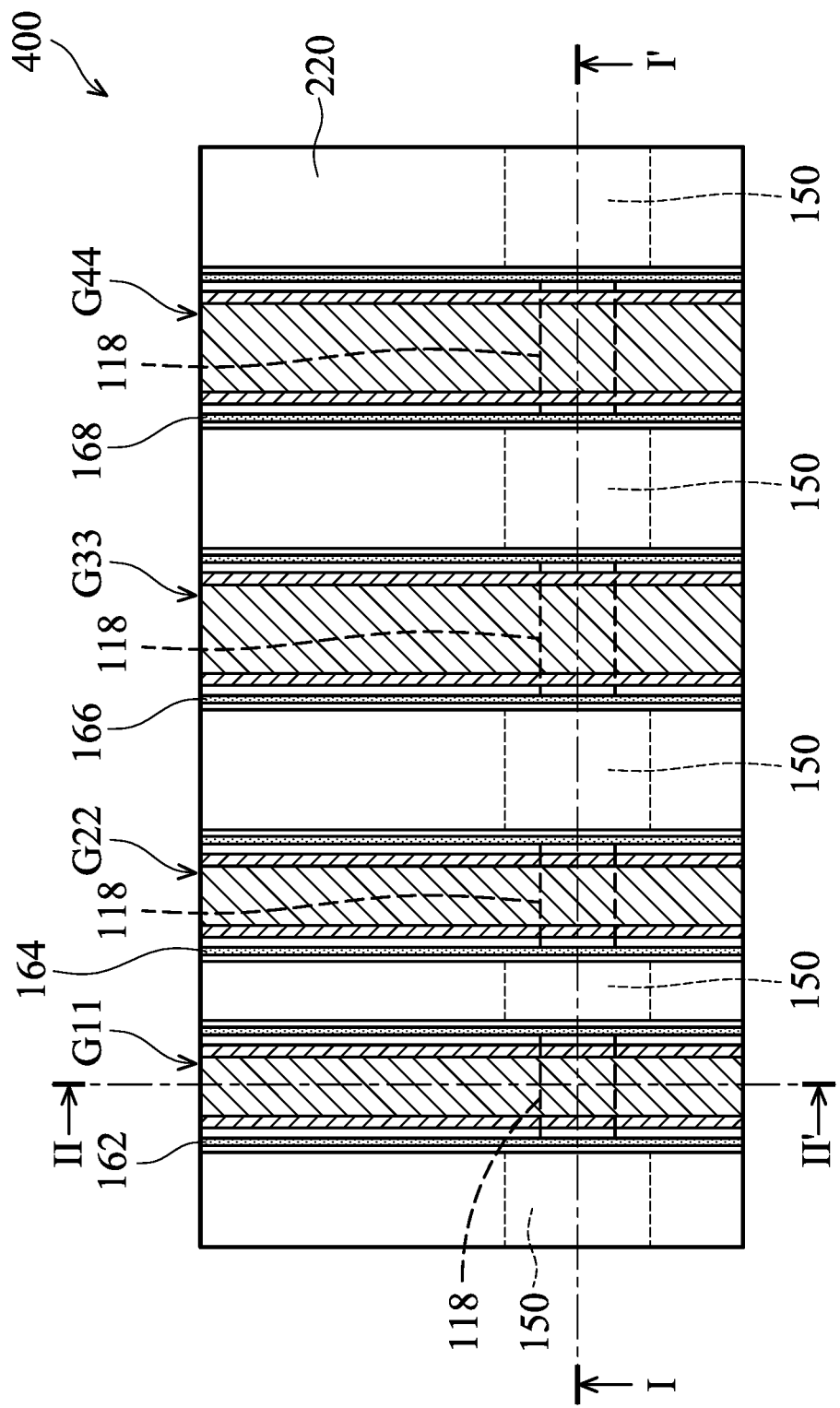
FIG. 4C is a top view of the semiconductor device structure of FIG. 4A, in accordance with some embodiments.

FIG. 4A is a cross-sectional view of a semiconductor device structure 400, in accordance with some embodiments. FIG. 4B is a perspective view of the semiconductor device structure 400 of FIG. 4A, in accordance with some embodiments. FIG. 4C is a top view of the semiconductor device structure 400 of FIG. 4A, in accordance with some embodiments.

Figure 4D:
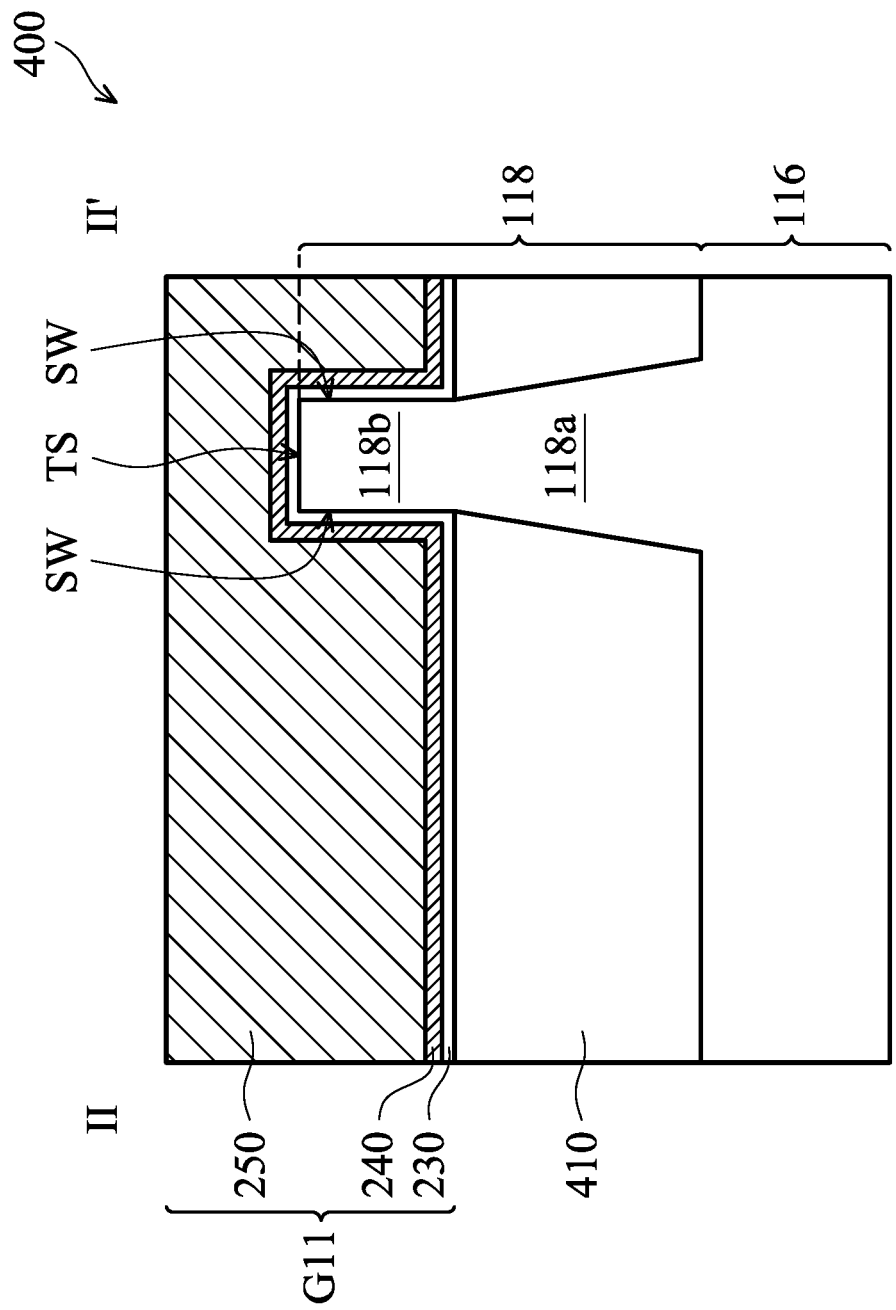
FIG. 4D is a cross-sectional view illustrating the semiconductor device structure along a sectional line II-II' in FIG. 4C, in accordance with some embodiments.

FIG. 4A is a cross-sectional view illustrating the semiconductor device structure 400 along a sectional line I-I' in FIG. 4C, in accordance with some embodiments. FIG. 4D is a cross-sectional view illustrating the semiconductor device structure 400 along a sectional line II-II' in FIG. 4C, in accordance with some embodiments. For the sake of simplicity, the etching stop layer 260, the dielectric spacer liner layer 290, the contact structures 311, 312, 313, 314, and 315, the dielectric layer 320, and the conductive via structures 332, 334, 336, and 338 are omitted in FIGS. 4B and 4C, in accordance with some embodiments.

As shown in FIGS. 4A-4D, the semiconductor device structure 400 is similar to the semiconductor device structure 400 of FIG. 1U, except that the semiconductor substrate 110 of the semiconductor device structure 400 of FIG. 4A includes a base portion 116 and a fin structure 118, in accordance with some embodiments. The fin structure 118 is over the base portion 116, in accordance with some embodiments.

The semiconductor device structure 400 further includes an isolation structure 410 over the base portion 116 and covers a lower portion 118a of the fin structure 118, in accordance with some embodiments. The isolation structure 410 includes a dielectric material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The gate stacks G11, G22, G33, and G44 are formed over the isolation structure 410 and an upper portion 118b of the fin structure 118, in accordance with some embodiments. The gate stacks G11, G22, G33, and G44 cover portions of side walls SW and a top surface TS of the upper portion 118b, in accordance with some embodiments. The stressors 150 are formed over the lower portion 118a, in accordance with some embodiments. The gate stacks G11, G22, G33, and G44 are between the stressors 150, in accordance with some embodiments.

Figure 5A:
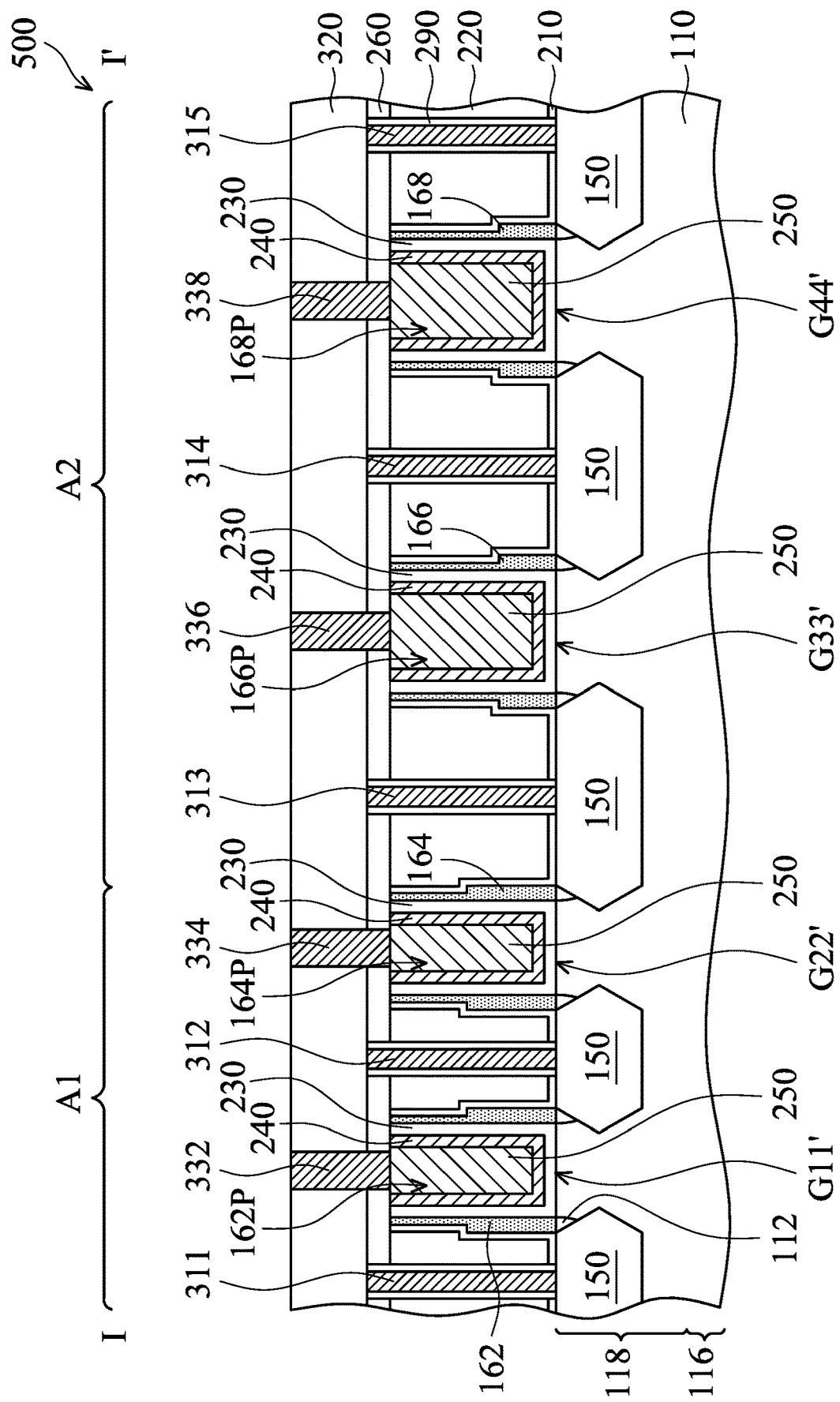
FIG. 5A is a cross-sectional view of a semiconductor device structure, in accordance with some embodiments.
Figure 5B:
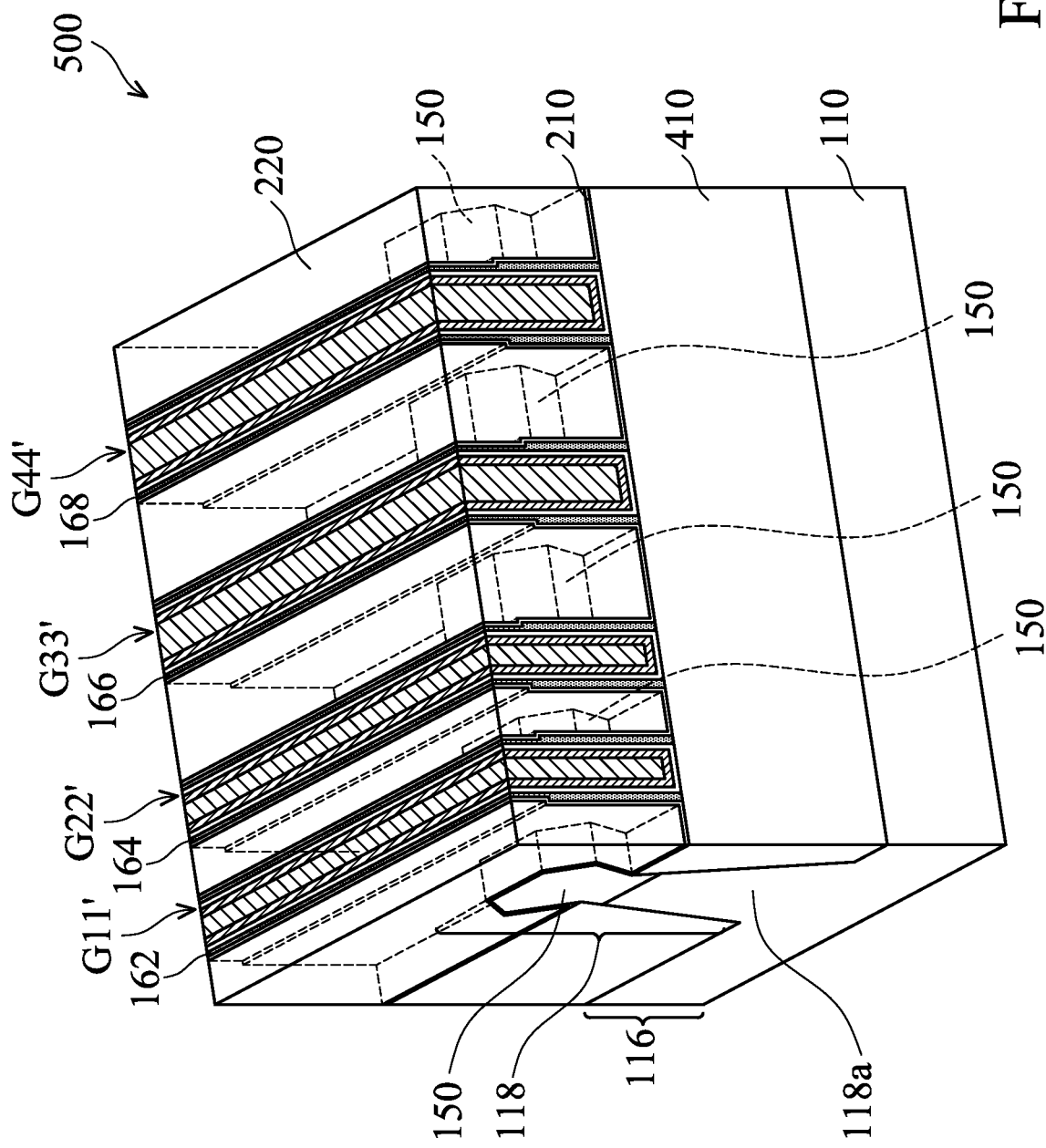
FIG. 5B is a perspective view of the semiconductor device structure of FIG. 4A, in accordance with some embodiments.
Figure 5C:
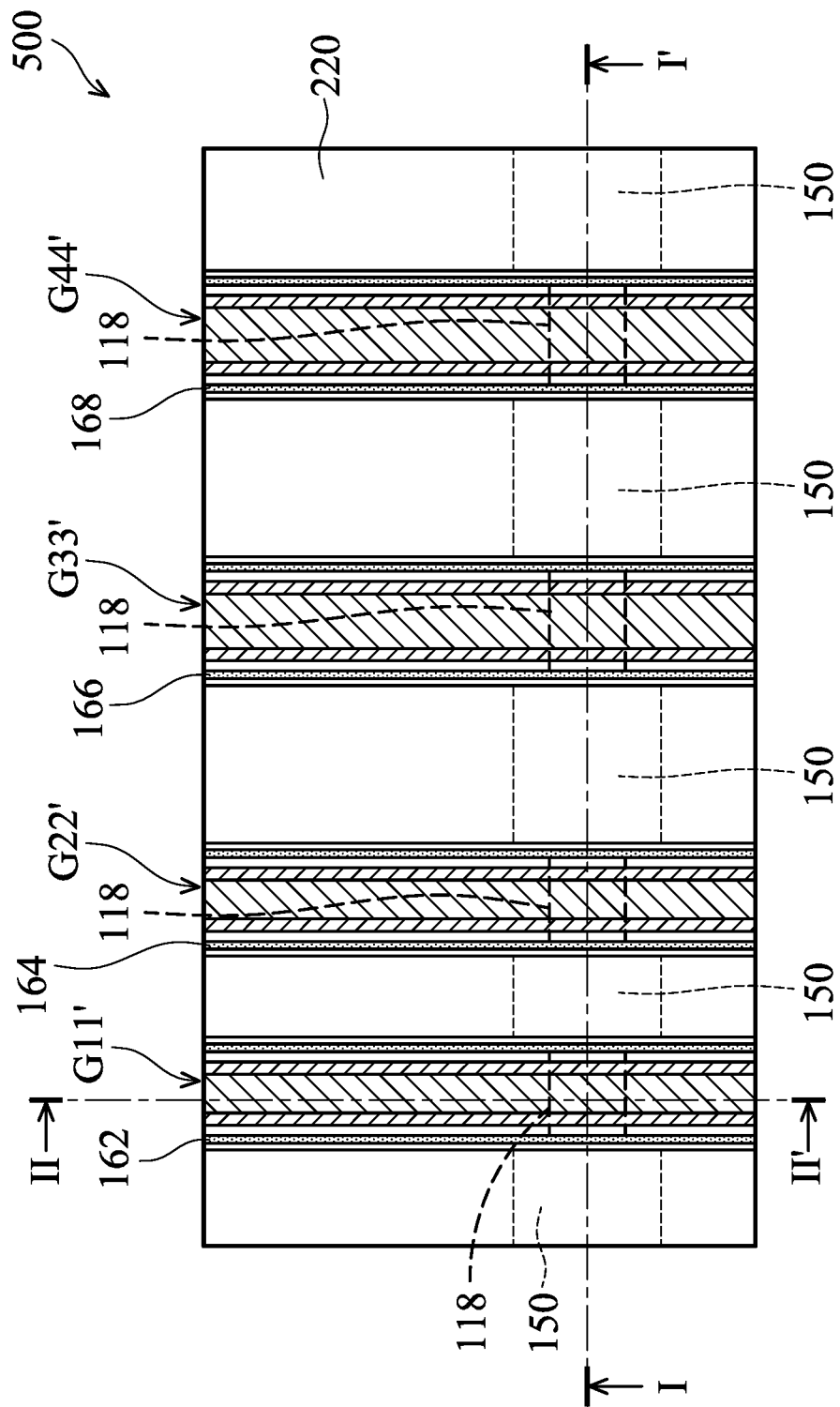
FIG. 5C is a top view of the semiconductor device structure of FIG. 4A, in accordance with some embodiments.

FIG. 5A is a cross-sectional view of a semiconductor device structure 500, in accordance with some embodiments. FIG. 5B is a perspective view of the semiconductor device structure 500 of FIG. 5A, in accordance with some embodiments. FIG. 5C is a top view of the semiconductor device structure 500 of FIG. 5A, in accordance with some embodiments.

Figure 5D:
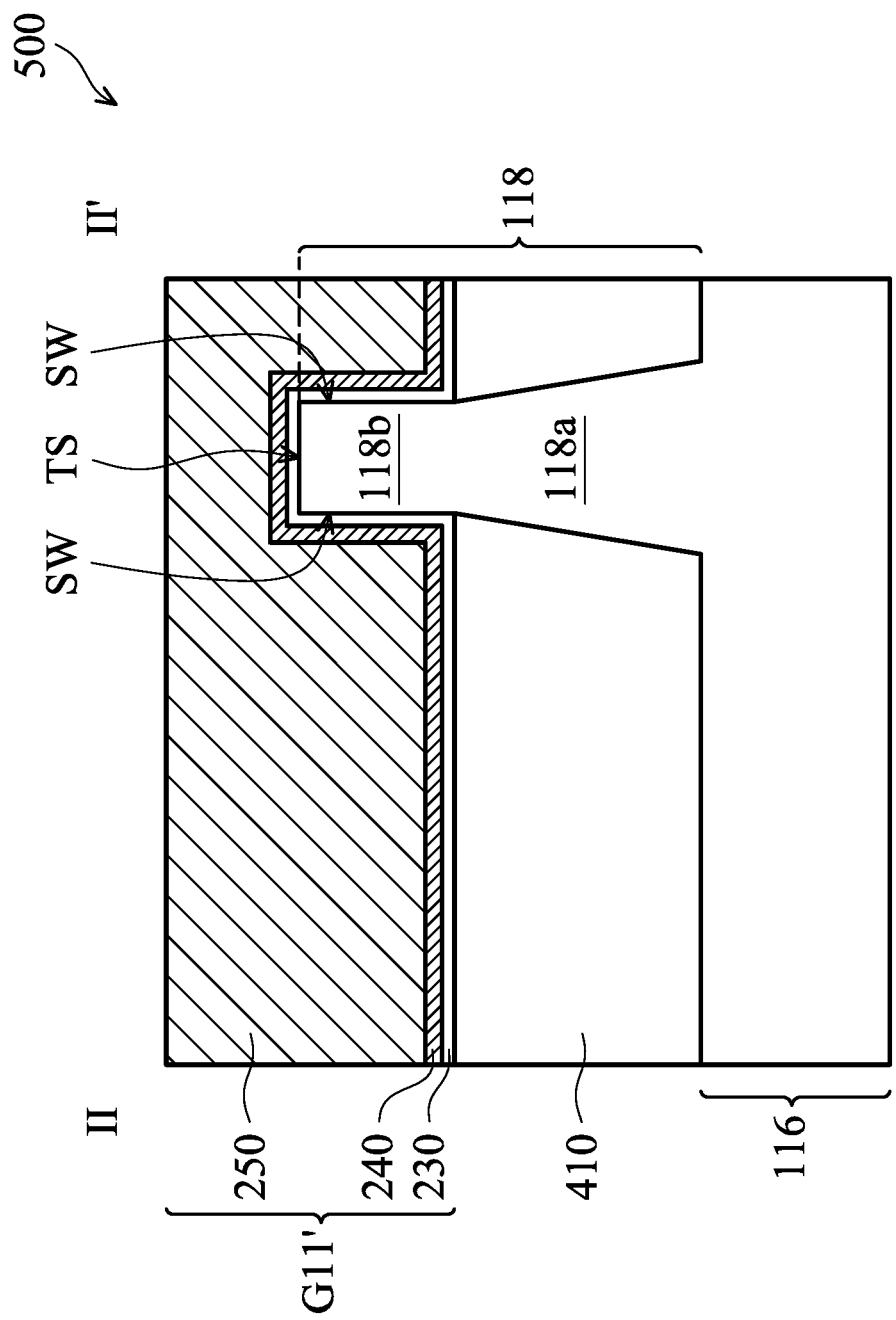
FIG. 5D is a cross-sectional view illustrating the semiconductor device structure along a sectional line II-II' in FIG. 5C, in accordance with some embodiments.

FIG. 5A is a cross-sectional view illustrating the semiconductor device structure 500 along a sectional line I-I' in FIG. 5C, in accordance with some embodiments. FIG. 5D is a cross-sectional view illustrating the semiconductor device structure 500 along a sectional line II-II' in FIG. 5C, in accordance with some embodiments. For the sake of simplicity, the etching stop layer 260, the dielectric spacer liner layer 290, the contact structures 311, 312, 313, 314, and 315, the dielectric layer 320, and the conductive via structures 332, 334, 336, and 338 are omitted in FIGS. 5B and 5C, in accordance with some embodiments.

As shown in FIGS. 5A-5D, the semiconductor device structure 500 is similar to the semiconductor device structure 500 of FIG. 3B, except that the semiconductor substrate 110 of the semiconductor device structure 500 of FIG. 5A includes a base portion 116 and a fin structure 118, in accordance with some embodiments. The fin structure 118 is over the base portion 116, in accordance with some embodiments.

The semiconductor device structure 500 further includes an isolation structure 410 over the base portion 116 and covers a lower portion 118a of the fin structure 118, in accordance with some embodiments. The isolation structure 410 includes a dielectric material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The gate stacks G11', G22', G33', and G44' are formed over the isolation structure 410 and an upper portion 118b of the fin structure 118, in accordance with some embodiments. The gate stacks G11', G22', G33', and G44' cover portions of side walls SW and a top surface TS of the upper portion 118b, in accordance with some embodiments. The stressors 150 are formed over the lower portion 118a, in accordance with some embodiments. The gate stacks G11', G22', G33', and G44' are between the stressors 150, in accordance with some embodiments.

Figure 6A:
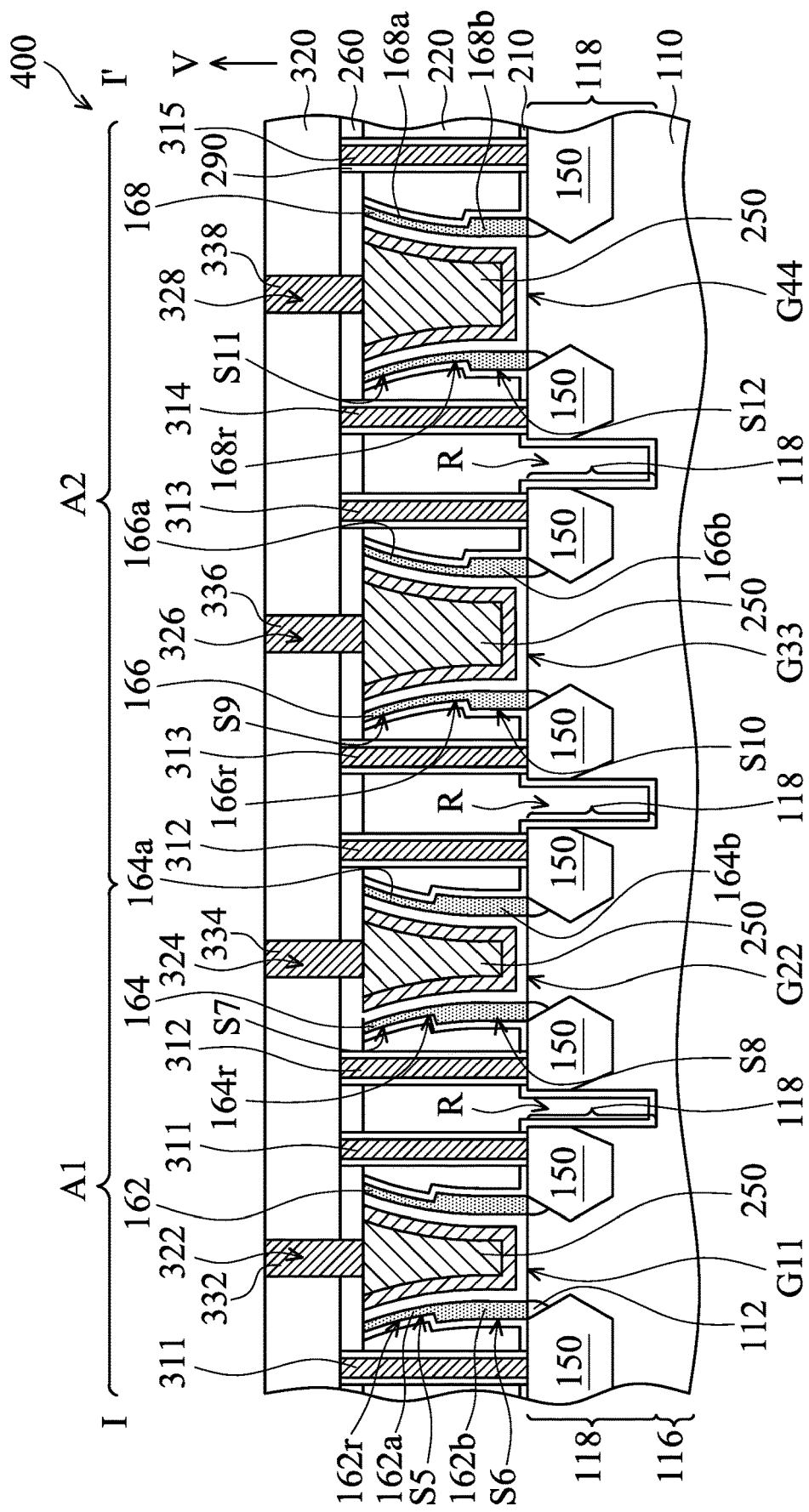
FIG. 6A is a cross-sectional view of a semiconductor device structure, in accordance with some embodiments.
Figure 6B:
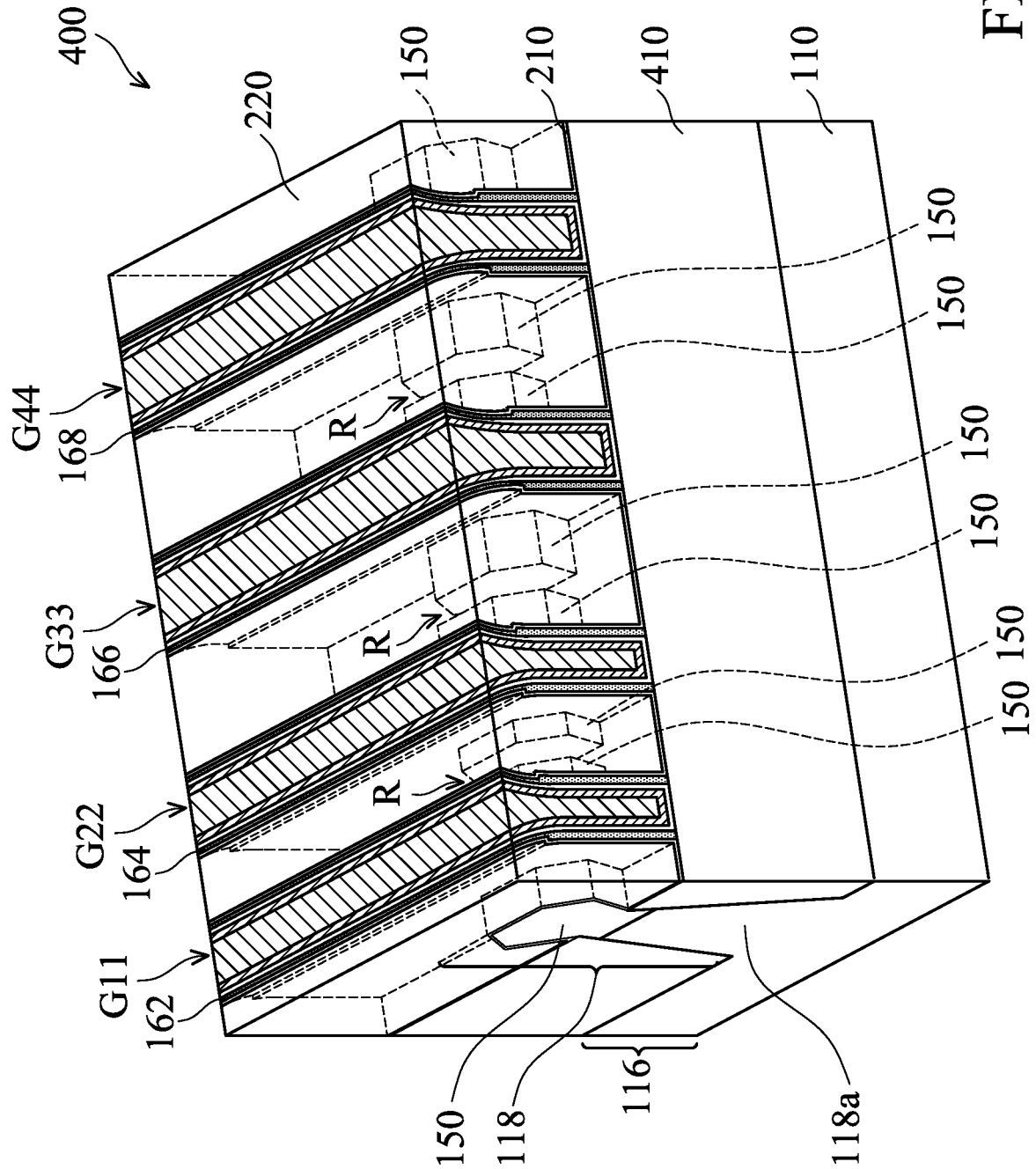
FIG. 6B is a perspective view of the semiconductor device structure of FIG. 6A, in accordance with some embodiments.

FIG. 6A is a cross-sectional view of a semiconductor device structure, in accordance with some embodiments. FIG. 6B is a perspective view of the semiconductor device structure of FIG. 6A, in accordance with some embodiments.

As shown in FIGS. 6A and 6B, the semiconductor device structure 400 is similar to the semiconductor device structure 400 of FIG. 4A, except that the semiconductor substrate 110 of the semiconductor device structure 400 of FIG. 6A includes a base portion 116 and fin structures 118, in accordance with some embodiments. The fin structures 118 are over the base portion 116, in accordance with some embodiments.

The fin structures 118 are spaced apart from each other, in accordance with some embodiments. In some embodiments, recesses R are between the fin structures 118. The gate stacks G11, G22, G33, and G44 are formed over the isolation structure 410 and the respective fin structures 118, in accordance with some embodiments.

Figure 7A:
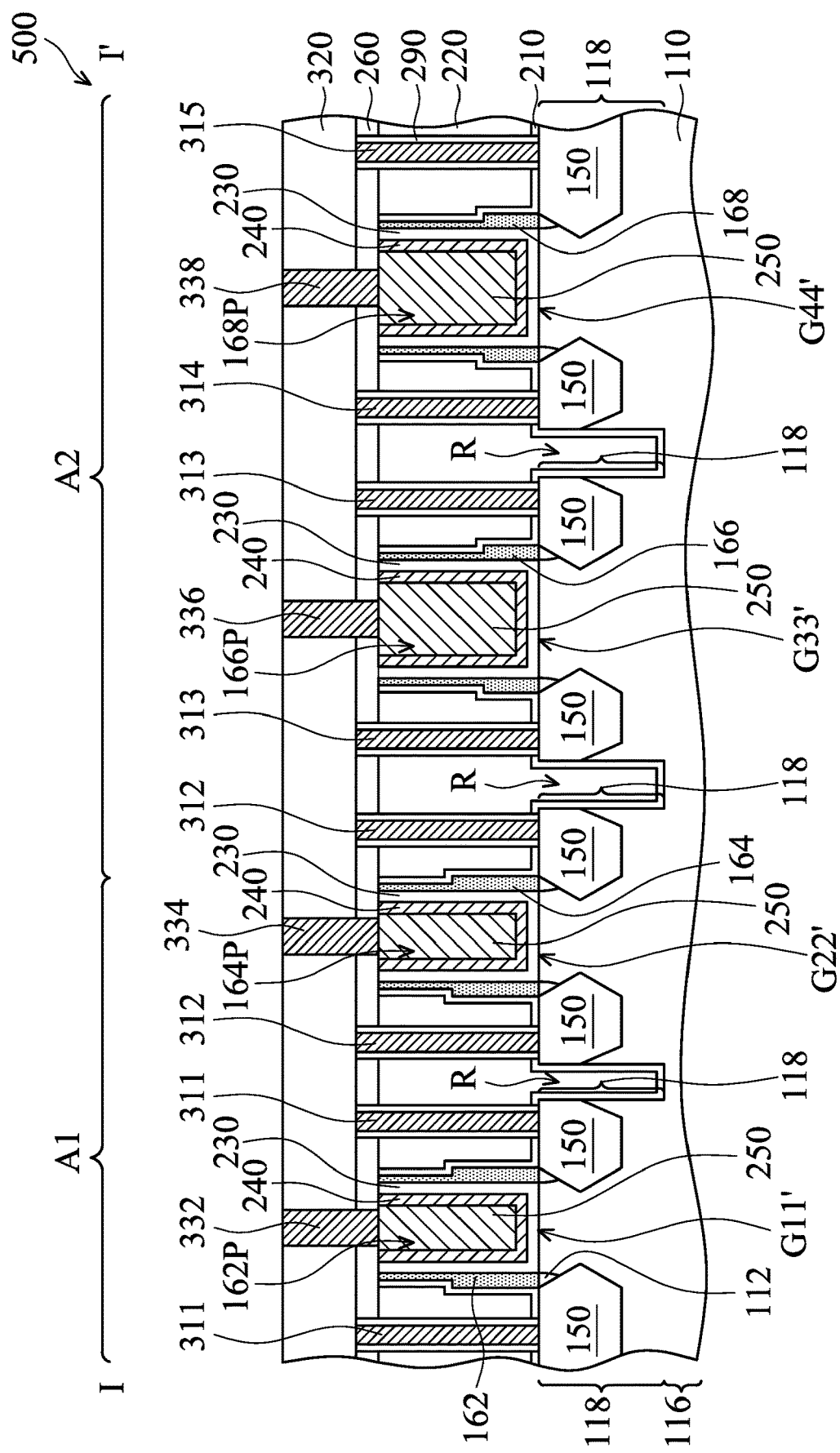
FIG. 7A is a cross-sectional view of a semiconductor device structure, in accordance with some embodiments.
Figure 7B:
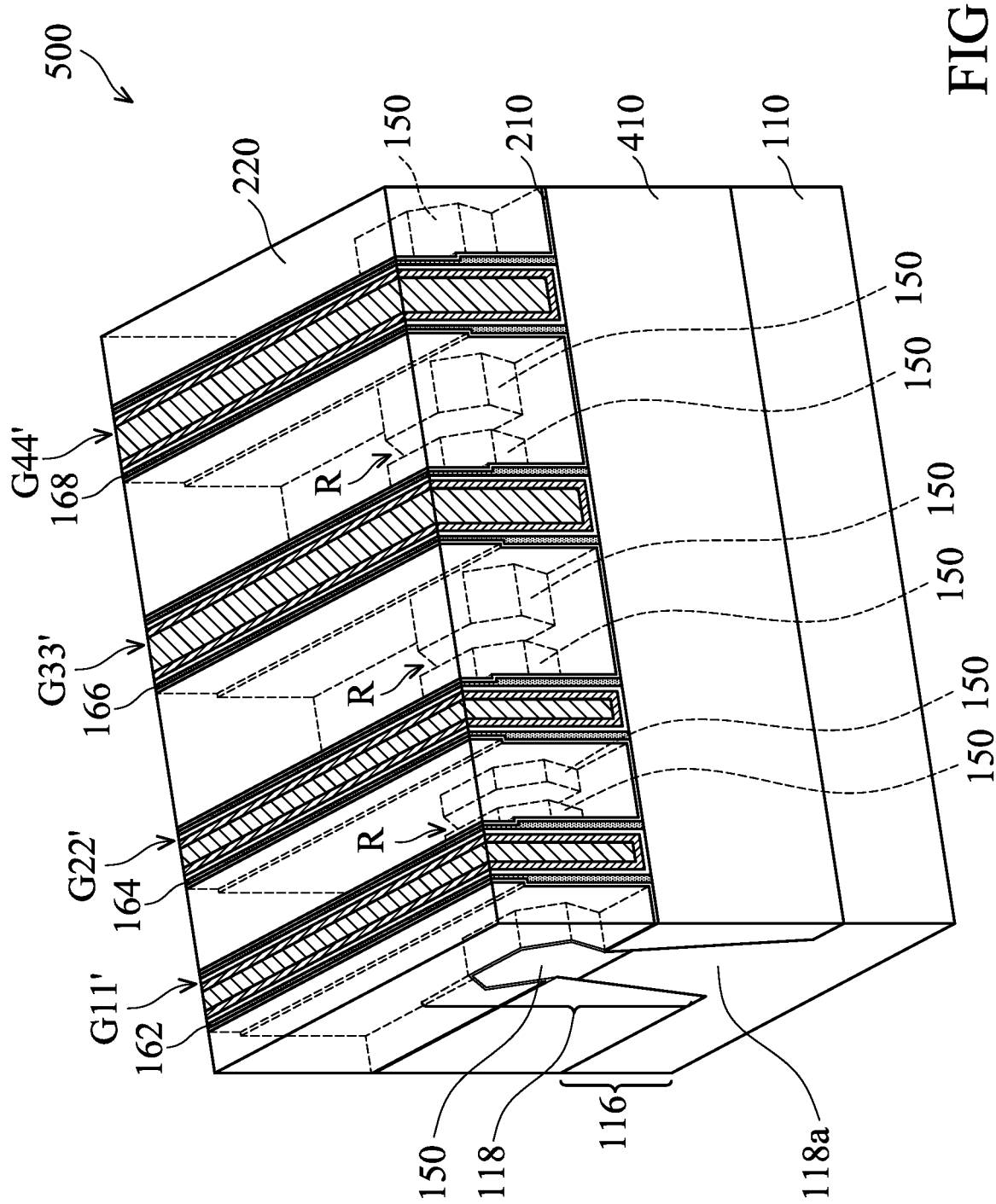
FIG. 7B is a perspective view of the semiconductor device structure of FIG. 7A, in accordance with some embodiments.

FIG. 7A is a cross-sectional view of a semiconductor device structure, in accordance with some embodiments. FIG. 7B is a perspective view of the semiconductor device structure of FIG. 7A, in accordance with some embodiments.

As shown in FIGS. 7A and 7B, the semiconductor device structure 500 is similar to the semiconductor device structure 500 of FIG. 5A, except that the semiconductor substrate 110 of the semiconductor device structure 500 of FIG. 7A includes a base portion 116 and fin structures 118, in accordance with some embodiments. The fin structures 118 are over the base portion 116, in accordance with some embodiments.

The fin structures 118 are spaced apart from each other, in accordance with some embodiments. In some embodiments, recesses R are between the fin structures 118. The gate stacks G11', G22', G33', and G44' are formed over the isolation structure 410 and the respective fin structures 118, in accordance with some embodiments.

In accordance with some embodiments, semiconductor device structures and methods for forming the same are provided. The methods (for forming the semiconductor device structure) form gate stacks with different gaps therebetween. The methods form a protective layer over the gate stacks and source/drain regions to protect the source/drain regions from damage during subsequent processes. The methods remove the protective layer over the gate stacks to reduce the loading effect of a mask layer subsequently formed in the gaps.

In accordance with some embodiments, a semiconductor device structure is provided. The semiconductor device structure includes a substrate. The semiconductor device structure includes a gate stack over the substrate, wherein the gate stack has a first portion and a second portion under the first portion, and the first portion is wider than the second portion. The semiconductor device structure includes a first spacer and a second spacer over opposite sides of the gate stack. The first spacer has a first upper portion and a first lower portion, the second spacer has a second upper portion and a second lower portion. The first spacer has a first recess, the first upper portion is between the first recess and the gate stack, the first lower portion is under the first recess, and the first recess has a first inner wall facing away from the gate stack. The second spacer has a second recess, the second upper portion is between the second recess and the gate stack, the second lower portion is under the second recess, the second recess has a second inner wall facing away from the gate stack, and a first distance between the first inner wall and the second inner wall increases in a direction away from the substrate.

In accordance with some embodiments, a semiconductor device structure is provided. The semiconductor device structure includes a substrate comprising a fin structure. The semiconductor device structure includes a first gate stack over the fin structure. The semiconductor device structure includes a first spacer layer surrounding the first gate stack, wherein the first spacer layer has a first upper portion and a first lower portion, the first upper portion is thinner than the first lower portion, and the first spacer layer has a recess between the first upper portion and the first lower portion and recessing toward the first gate stack. The semiconductor device structure includes a second gate stack over the fin structure. The semiconductor device structure includes a third gate stack over the fin structure, wherein the second gate stack is wider than the third gate stack, and a first distance between the first gate stack and the third gate stack is less than a second distance between the first gate stack and the second gate stack.

In accordance with some embodiments, a semiconductor device structure is provided. The semiconductor device structure includes a substrate. The semiconductor device structure includes a gate stack over the substrate, wherein the gate stack has a first portion and a second portion under the first portion, and the first portion is wider than the second portion. The semiconductor device structure includes a first spacer and a second spacer over opposite sides of the gate stack, wherein the first spacer has a first upper portion and a first lower portion, the second spacer has a second upper portion and a second lower portion, and a distance between the first upper portion and the second upper portion continuously increases in a direction away from the substrate. The first spacer has a recess, the first upper portion is between the recess and the gate stack, the first lower portion is under the recess, the recess has a curved inner wall and an inner wall, the curved inner wall faces away from the gate stack, and the inner wall faces away from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate;
a gate stack over the substrate, wherein the gate stack has a first portion and a second portion under the first portion, and the first portion is wider than the second portion;
a first spacer and a second spacer over opposite sides of the gate stack, wherein the first spacer has a first upper portion and a first lower portion, the second spacer has a second upper portion and a second lower portion,
the first spacer has a first recess, the first upper portion is between the first recess and the gate stack, the first lower portion is under the first recess, the first recess has a first inner wall facing away from the gate stack,
the second spacer has a second recess, the second upper portion is between the second recess and the gate stack, the second lower portion is under the second recess, the second recess has a second inner wall facing away from the gate stack, a first distance between the first inner wall and the second inner wall increases in a direction away from the substrate, and
a second distance between the first upper portion and the second upper portion is greater than a third distance between the first lower portion and the second lower portion;
an etch stop layer conformally covering the first inner wall and a third inner wall of the first recess and extending onto the substrate, wherein the third inner wall faces away from the substrate; and
a stressor embedded in the substrate, wherein the etch stop layer conformally covers the stressor.

2. The semiconductor device structure as claimed in claim 1, wherein the second distance increases in the direction away from the substrate.

3. The semiconductor device structure as claimed in claim 1, wherein the etch stop layer further conformally covers the second inner wall and a fourth inner wall of the second recess, and the fourth inner wall faces away from the substrate.

4. The semiconductor device structure as claimed in claim 1, further comprising:
a dielectric layer over the etch stop layer; and
a contact structure passing through the dielectric layer and the etch stop layer over the stressor.

5. The semiconductor device structure as claimed in claim 1, wherein the first distance continuously increases in the direction.

6. The semiconductor device structure as claimed in claim 1, wherein the first upper portion is thinner than the first lower portion, and the second upper portion is thinner than the second lower portion.

7. A semiconductor device structure, comprising:
a substrate comprising a fin structure;
a first gate stack over the fin structure;
a first spacer layer surrounding the first gate stack, wherein the first spacer layer has a first upper portion and a first lower portion, the first upper portion is thinner than the first lower portion, and the first spacer layer has a recess between the first upper portion and the first lower portion and recessing toward the first gate stack;
a second gate stack over the fin structure;
a third gate stack over the fin structure, wherein the second gate stack is wider than the third gate stack, and a first distance between the first gate stack and the third gate stack is less than a second distance between the first gate stack and the second gate stack; and
a second spacer layer surrounding the second gate stack, wherein the second spacer layer has a second upper portion and a second lower portion, the second upper portion is thinner than the second lower portion, and a first length of the first lower portion is greater than a second length of the second lower portion.

8. The semiconductor device structure as claimed in claim 7, further comprising:
a third spacer layer surrounding the third gate stack, wherein the third spacer layer has a third upper portion and a third lower portion, the third upper portion is thinner than the third lower portion, a third length of the third lower portion is greater than the second length of the second lower portion.

9. The semiconductor device structure as claimed in claim 7, wherein a first top surface of the first upper portion is aligned with a second top surface of the second upper portion.

10. The semiconductor device structure as claimed in claim 7, wherein the first spacer layer has an inner wall facing the first gate stack, and the inner wall is a curved inner wall.

11. The semiconductor device structure as claimed in claim 7, wherein the first gate stack has a second upper portion and a second lower portion, and the second upper portion is wider than the second lower portion.

12. The semiconductor device structure as claimed in claim 7, wherein a third length of the first upper portion is less than a fourth length of the second upper portion.

13. The semiconductor device structure as claimed in claim 7, wherein a third distance between the first upper portion and the second upper portion increases toward the substrate.

14. The semiconductor device structure as claimed in claim 7, wherein the second spacer layer has a first recess between the second upper portion and the second lower portion and recessing toward the second gate stack.

15. The semiconductor device structure as claimed in claim 14, wherein the recess of the first spacer layer is higher than the first recess of the second spacer layer.

16. The semiconductor device structure as claimed in claim 14, further comprising:
an etch stop layer conformally covering the recess of the first spacer layer and the first recess of the second spacer layer.

17. A semiconductor device structure, comprising:
a substrate;
a gate stack over the substrate, wherein the gate stack has a first portion and a second portion under the first portion, and the first portion is wider than the second portion; and
a first spacer and a second spacer over opposite sides of the gate stack, wherein the first spacer has a first upper portion and a first lower portion, the second spacer has a second upper portion and a second lower portion, a distance between the first upper portion and the second upper portion continuously increases in a direction away from the substrate,
the first spacer has a recess, the first upper portion is between the recess and the gate stack, the first lower portion is under the recess, the recess has a curved inner wall and an inner wall, the curved inner wall faces away from the gate stack, the inner wall faces away from the substrate, the gate stack comprises a gate electrode layer and a gate dielectric layer between the gate electrode layer and the substrate, and a first top surface of the gate electrode layer, a second top surface of the gate dielectric layer, a third top surface of the first spacer, and a fourth top surface of the second spacer are substantially coplanar.

18. The semiconductor device structure as claimed in claim 17, further comprising:
an etch stop layer partially in the recess and extending onto the substrate.

19. The semiconductor device structure as claimed in claim 18, wherein the etch stop layer conformally covers the curved inner wall and the inner wall.

20. The semiconductor device structure as claimed in claim 17, wherein the first spacer and the second spacer are in direct contact with the gate stack.

* * * * *